United States Patent

Shigyo et al.

[11] Patent Number: 6,051,452
[45] Date of Patent: Apr. 18, 2000

[54] METHOD FOR MANUFACTURING A SEMICONDUCTOR DEVICE WITH ION IMPLANTATION

[75] Inventors: Naoyuki Shigyo, Yokohama; Toshiyuki Enda, Chigasaki, both of Japan

[73] Assignee: Kabushiki Kaisha Toshiba, Kawasaki, Japan

[21] Appl. No.: 09/003,339

[22] Filed: Jan. 6, 1998

Related U.S. Application Data

[62] Division of application No. 08/536,451, Sep. 29, 1995, Pat. No. 5,760,442.

[30] Foreign Application Priority Data

Sep. 29, 1994 [JP] Japan .................................. 6-233928
Sep. 19, 1995 [JP] Japan .................................. 7-240337

[51] Int. Cl.[7] ...................... H01L 31/0392; H01L 31/113
[52] U.S. Cl. ....................... 438/151; 438/162; 438/288; 438/289
[58] Field of Search ................................ 257/192, 616, 257/347, 348; 438/149, 151, 152, 156, 164

[56] References Cited

U.S. PATENT DOCUMENTS

| | | | |
|---|---|---|---|
| 5,103,277 | 4/1992 | Caviglia et al. | 257/348 |
| 5,354,700 | 10/1994 | Huang et al. | 438/151 |
| 5,378,923 | 1/1995 | Mitsui et al. | 257/616 |
| 5,482,871 | 1/1996 | Pollack | 438/151 |
| 5,485,030 | 1/1996 | Terashima | 257/347 |
| 5,543,338 | 8/1996 | Shimoji | 438/151 |
| 5,698,869 | 12/1997 | Yoshimi et al. | 257/192 |

FOREIGN PATENT DOCUMENTS

| | | |
|---|---|---|
| 57-177559 | 11/1982 | Japan . |
| 4-98879 | 3/1992 | Japan .................................. 257/347 |
| 5-206467 | 8/1993 | Japan . |
| 5-299437 | 11/1993 | Japan . |
| 6-314790 | 11/1994 | Japan . |

OTHER PUBLICATIONS

An Analysis of the Concave MOSFET, by Kenhi Natori et al, IEEE Transactions On Electron Devices, vol. Ed. 35, No. 4, Apr., 1978, pp. 448–456.

*Primary Examiner*—Wael M. Fahmy
*Assistant Examiner*—William David Coleman
*Attorney, Agent, or Firm*—Oblon, Spivak, McClelland, Maier & Neustadt, P.C.

[57] ABSTRACT

A silicon oxide layer serving as an insulation layer is formed on a p-type semiconductor substrate. An $n^+$-type source and drain regions are formed on the p-type substrate 110 with a spacing therebetween. A channel region is interposed between the source and drain regions. A silicon oxide layer serving as an insulation layer is formed on the channel region. A gate terminal is formed on the silicon oxide layer. High-concentration p-type regions are formed in the p-type semiconductor substrate under the source and drain regions, respectively.

4 Claims, 20 Drawing Sheets

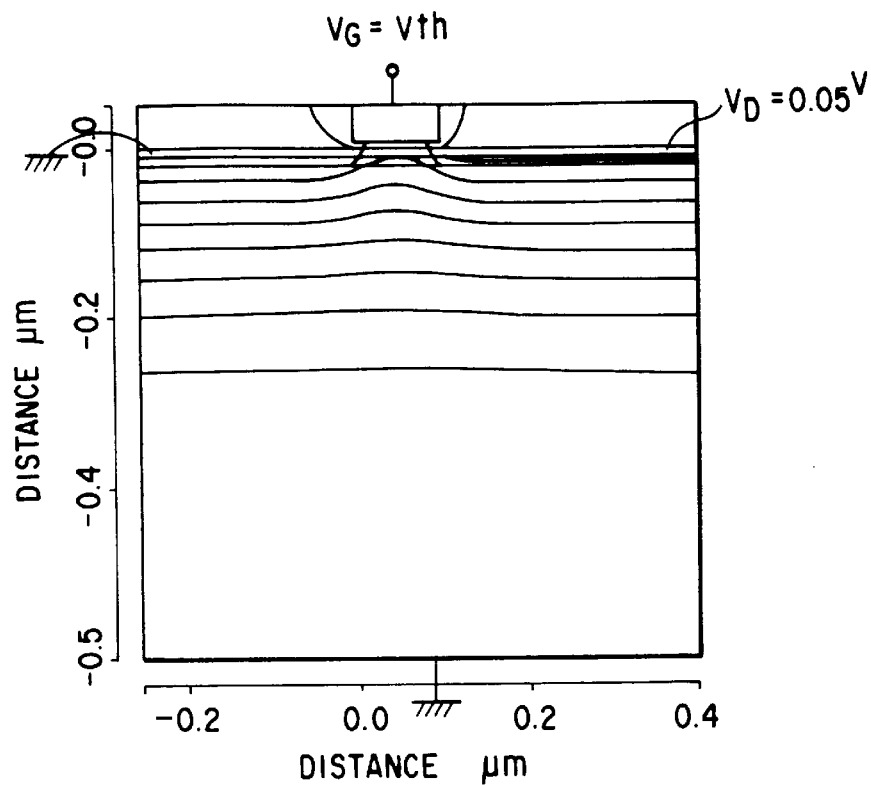
FIG. 4
(PRIOR ART)
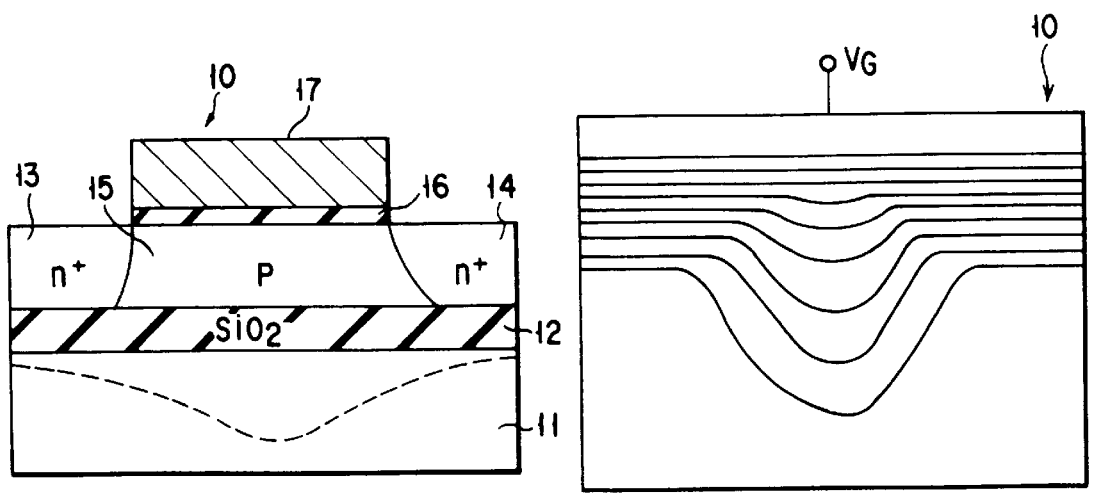
FIG. 5
FIG. 6

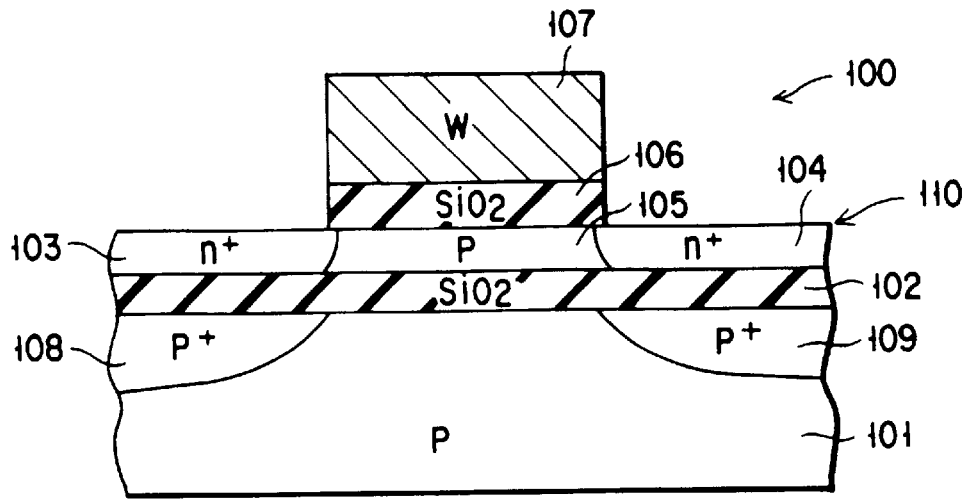
F I G. 7
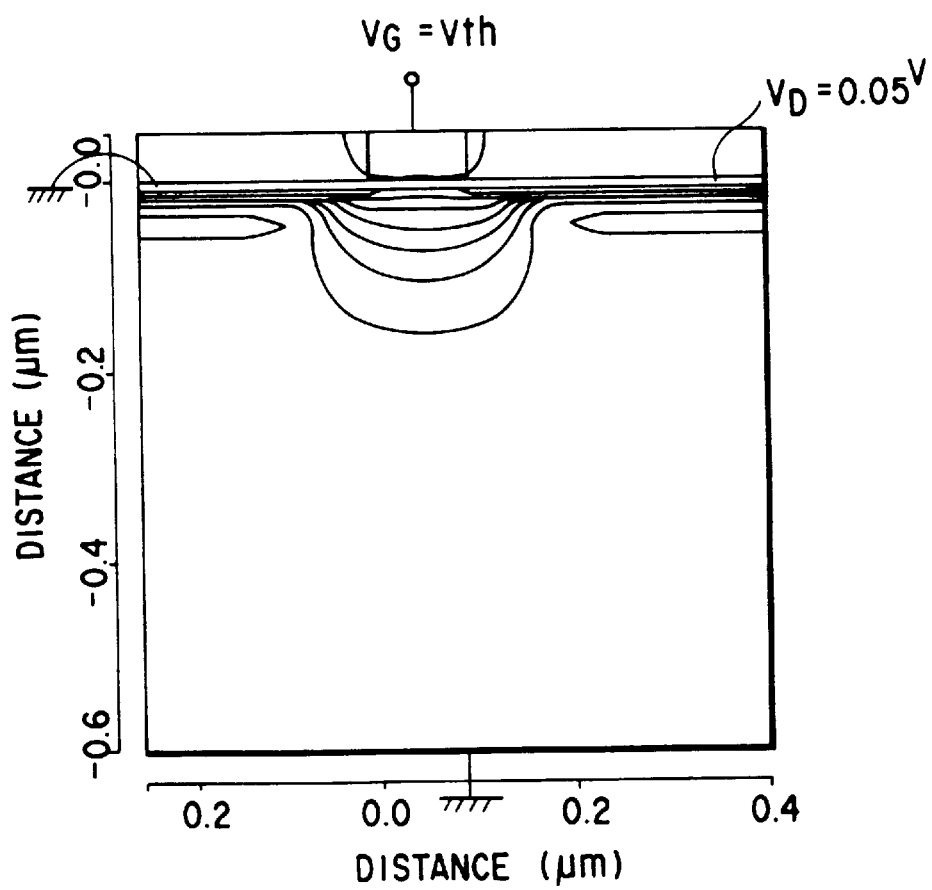
F I G. 8

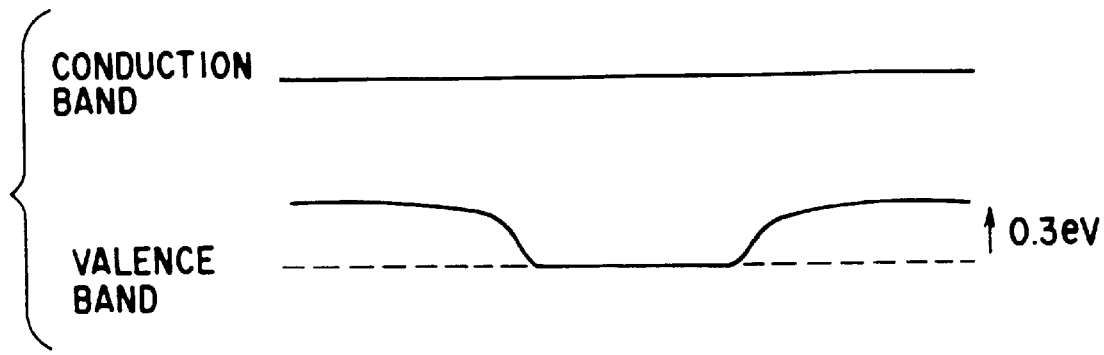
F I G. 12
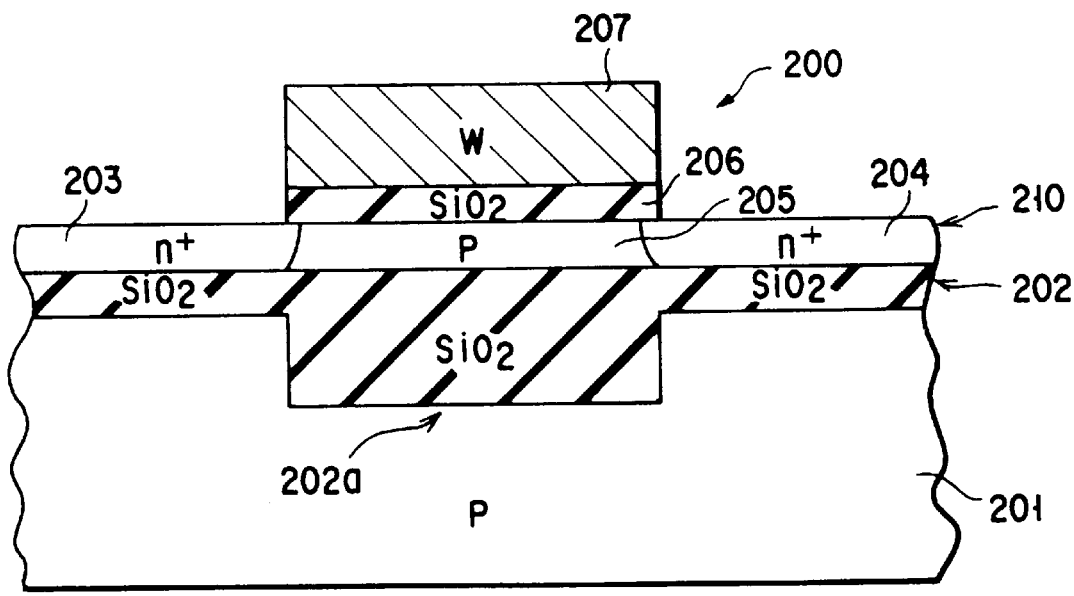
F I G. 13

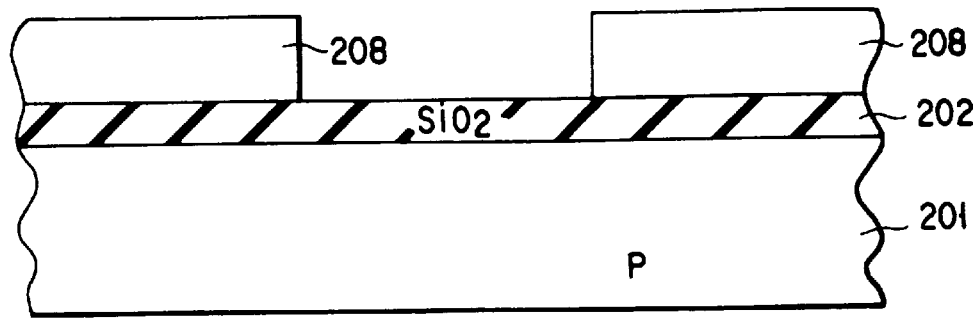
F I G. 15A
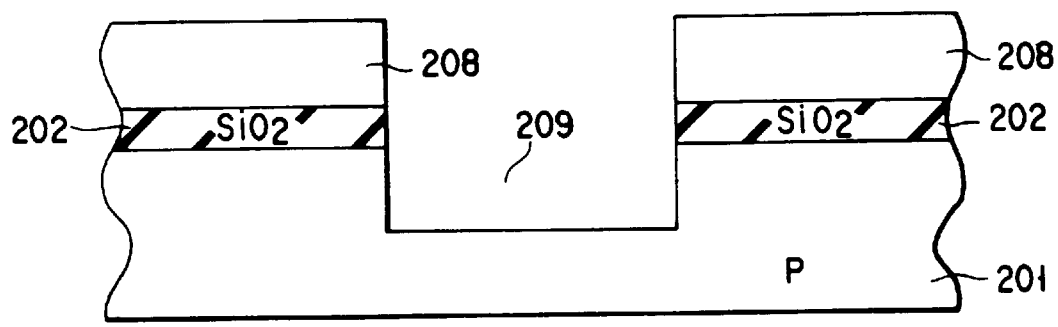
F I G. 15B
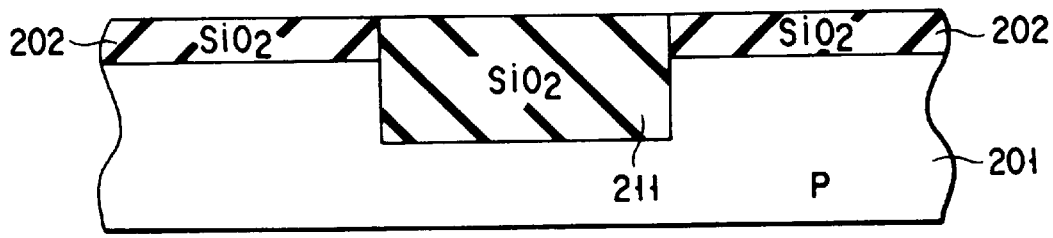
F I G. 15C
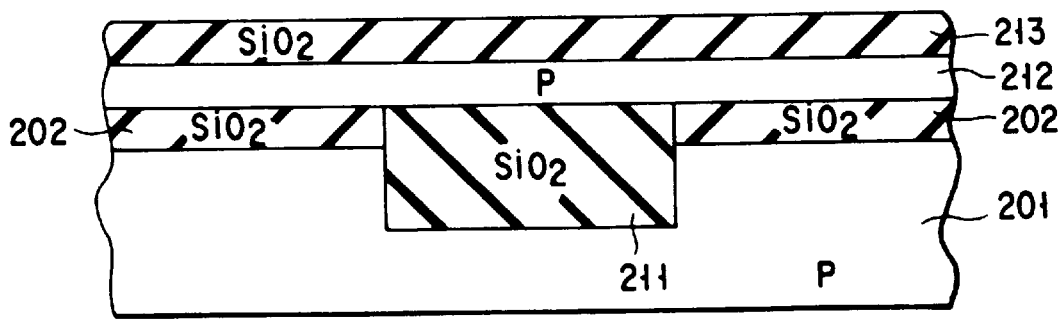
F I G. 15D

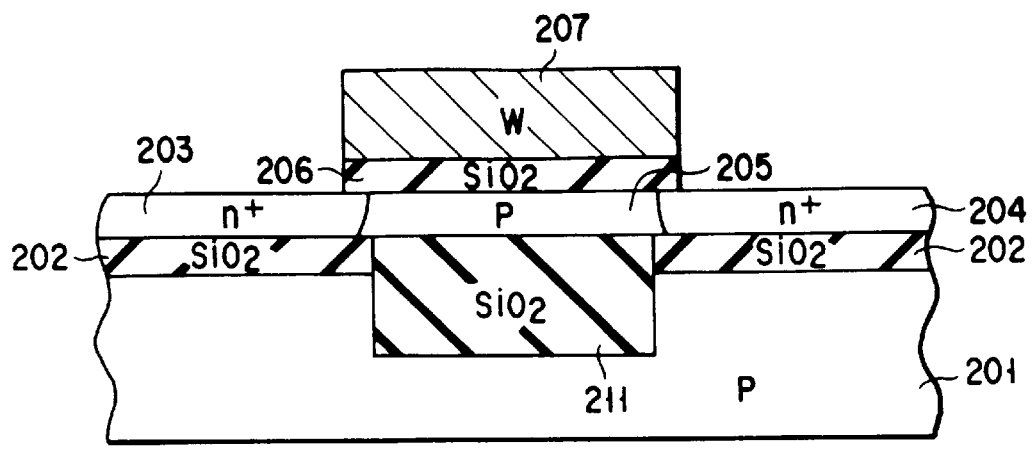
F I G. 15E
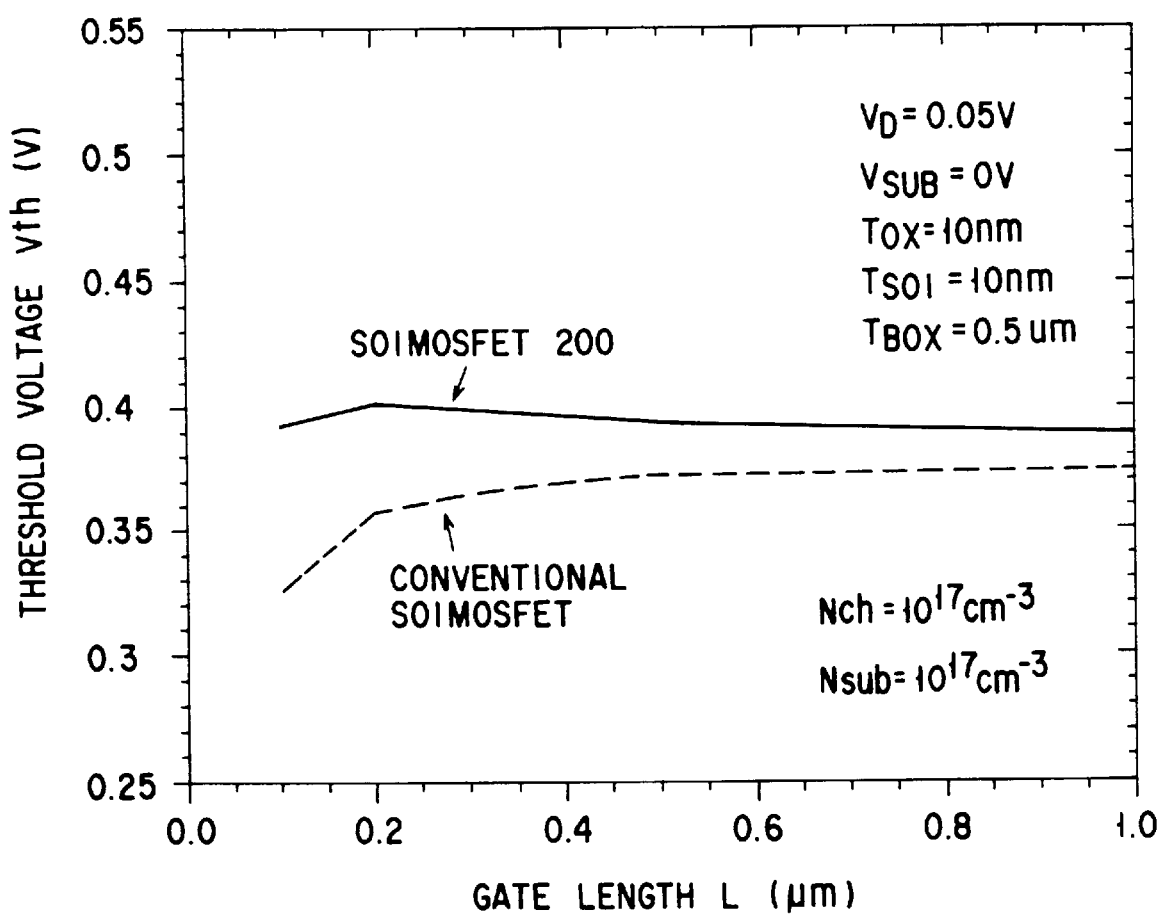
F I G. 16

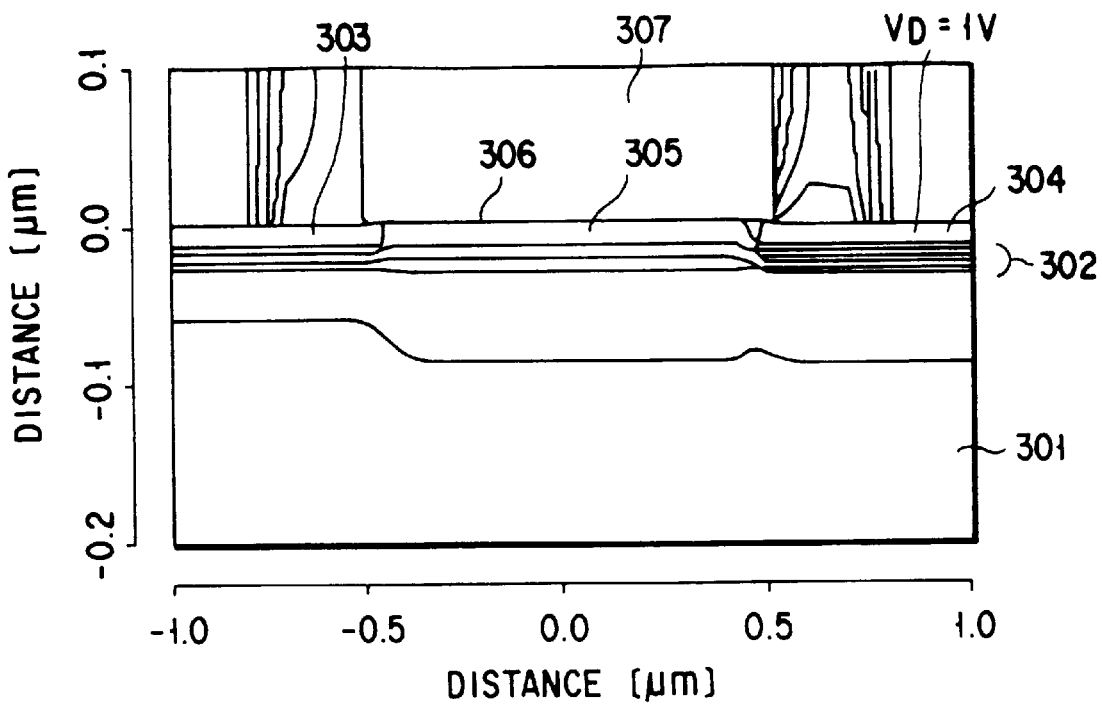
F I G. 21 A
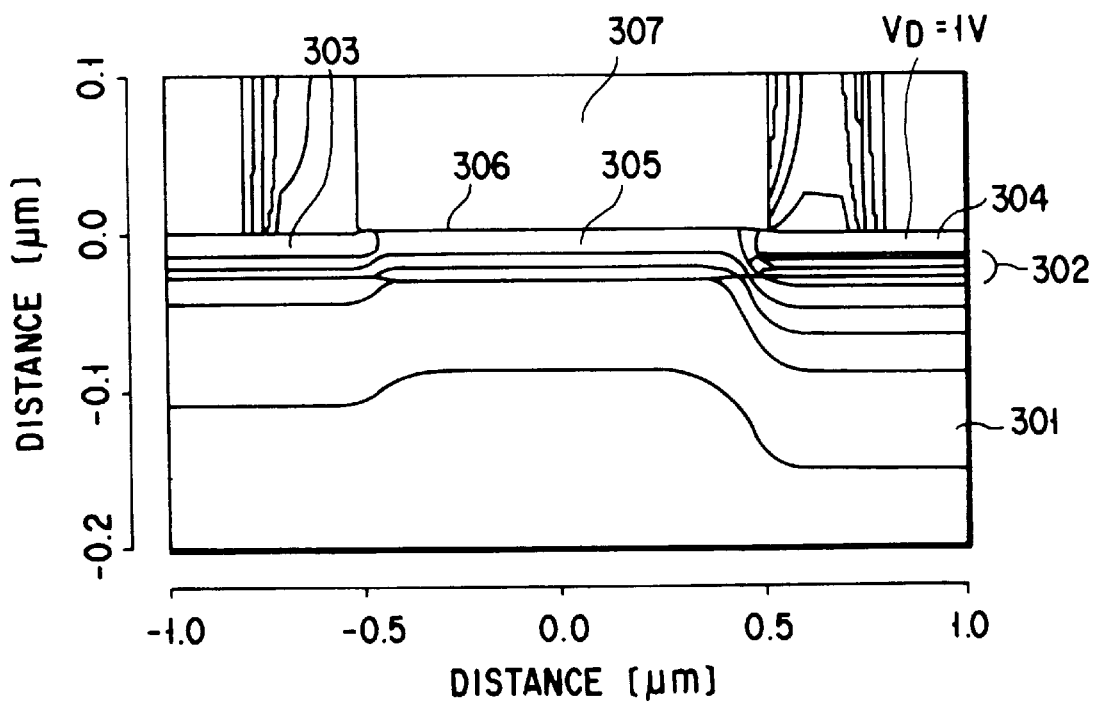
F I G. 21 B

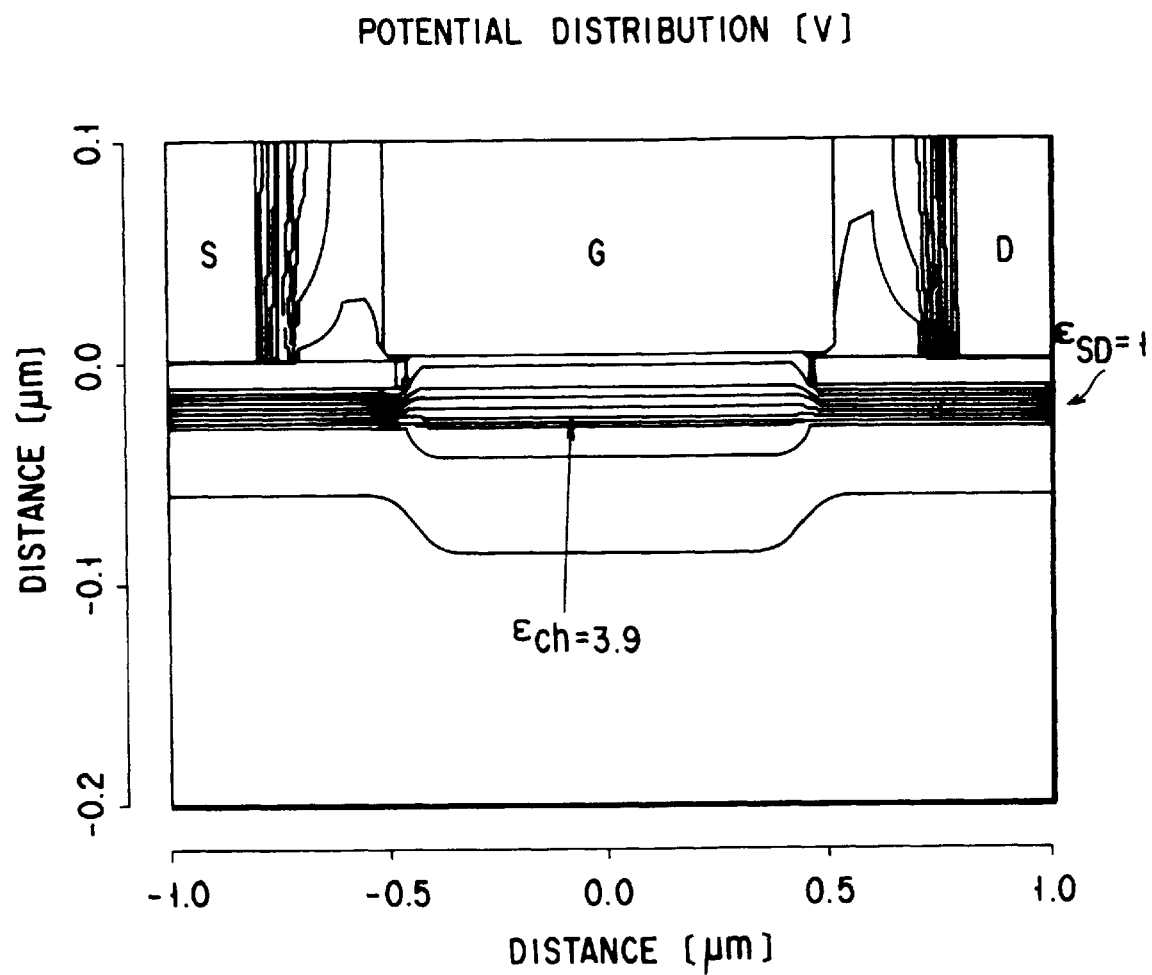
F I G. 25

METHOD FOR MANUFACTURING A SEMICONDUCTOR DEVICE WITH ION IMPLANTATION

This application is a division of application Ser. No. 08/536,451, filed on Sep. 29, 1995, now U.S. Pat. No. 5,760,442.

BACKGROUND OF THE INVENTION

1. Field of the Invention

The present invention relates to an MIS (Metal Insulator Semiconductor) type semiconductor device and a method for manufacturing the same and, more specifically, to an SOI (Silicon on Insulator) type MISFET and a method for manufacturing the same.

2. Description of the Related Art

An FET (Field Effect Transistor) having an MIS structure, i.e., an MISFET, which is employed in an LSI (Large Scale Integration) circuit, a VSLI (Very Large Scale Integration) circuit, and further a power device, a CCD (Charge Coupled Device), etc., has been steadily decreased in size. The decrease in size, however, causes some problems, especially, a lowering in threshold voltage Vth due to the short channel effect or the like.

If the channel length of the MISFET is reduced to be almost equal to the depletion layer width of source and drain regions, both a gate voltage in the longitudinal direction and a drain electric field in the lateral direction have an effect (two-dimensional effect) on the distribution of potentials in the device. Therefore, the hypothesis that the electric field in the longitudinal direction is considerably stronger than that in the lateral direction cannot be made, in other words, a gradual channel approximation is not achieved, with the result that the short channel effect is manifested.

If the channel length is decreased, the charge of the channel region is effected by the charge in the source and drain regions as well as by the charge in the gate region, in virtue of the two-dimensional effect described above. Consequently, an inversion layer is formed by less gate charges or lower gate voltage, and the threshold voltage Vth is decreased. FIG. 1 illustrates the expanse of a depletion layer of the MISFET when the short channel effect appears. In FIG. 1, $Q_G$ indicates the charge effected by the gate, $Q_S$ does the charge effected by the source, and $Q_D$ does the charge effected by the drain. FIG. 2 schematically shows a typical example of equipotential lines in the MISFET when the short channel effect occurs.

If the threshold voltage Vth of the MISFET is expressed by:

$$Vth = V_{FB} + \phi s + Q_B / Cox$$

($V_{FB}$: flat band voltage, $\phi s$: surface potential on the source, $Q_B$: charge of the depletion layer when the short channel effect is ignored, and Cox: electrostatic capacitance of gate insulating film)

variation in a threshold voltage $\Delta Vth$, caused by the decrease in size, is given as follows:

$$\Delta Vth = \Delta \phi s + \Delta Q_B / Cox.$$

$\Delta \phi s$ denotes a decrease in surface potential due to DIBL (Drain Induced Barrier Lowering). The DIBL is a phenomenon in which a potential barrier in the source is changed by the drain voltage. The term $\Delta Q_B / Cox$ indicates a threshold voltage drop due to a reduction in charge of the gate due to the foregoing short channel effect, which is called charge sharing.

An MISFET having an SOI structure capable of realizing a complete separation between elements by forming a silicon thin film on an insulation substrate, has recently attracted attention and, in particular, a full depletion type thin-film SOI device is being widely studied as a deep submicron device whose channel length is set to 0.1 µm.

The thin-film SOI device has three great advantages: an increase in mobility due to a relaxation of vertical electric field in a channel region, a reduction in electrostatic capacitance of source/drain region, and suppression of short channel effect. These advantages allow a considerably high-speed operation.

It is known that an SOI transistor formed on an insulation film has the advantages of reducing an amount of stray capacitance and not being affected by soft errors. It is reported that, by thinning an SOI layer, it is completed depleted, the mobility of electrons or holes is increased, the switching characteristic is improved, and a threshold voltage drop due to a decrease in channel length (short channel effect) is smaller than that in an MISFET formed in bulk (M. Yoshimi et al., IEICE Trans., Vol. E74, p. 337, 1991).

FIG. 3 is a cross-sectional view of a conventional SOI-type MISFET. In this MISFET, a silicon oxide film layer 2 as an insulation film is formed on a p-type semiconductor substrate 1. On the silicon oxide film 2, an n$^+$-type source region 3 and an n$^+$-type drain region 4 are provided with a channel region 5 interposed therebetween. A silicon oxide film 6 as an insulation film is formed on the channel region 5, and a gate electrode 7 is formed on the silicon oxide film 6.

FIG. 4 illustrates the potential distribution when the gate voltage $V_G$ and drain voltage $V_D$ of the conventional SOI-type MISFET are Vth and 0.05V, respectively. Referring to FIG. 4, a depletion layer extends to the semiconductor substrate, and the equipotential lines are formed convexly in a ridge shape. In the convex potential distribution, the threshold voltage Vth is lowered in accordance with a reduction in channel length.

In the conventional SOI-type MISFET, the short channel effect is less than that of the MISFET formed in bulk, but the threshold voltage Vth is lowered in accordance with a reduction in channel length. Furthermore, the foregoing DIBL occurs as an unignorable problem in designing a deep submicron device.

Further, the thin-film SOI device (SOI-type MISFET) has a problem in which a threshold voltage is difficult to set. To reduce the electrostatic capacitance of the source and drain regions and suppress the short channel effect, the electrostatic capacitance between the SOI layer and substrate has to decrease. Since, in the conventional device, a silicon oxide film is used for a buried insulation film, the insulation film need to be thickened in order to reduce the capacitance. If, however, the buried insulation film is thickened, the electrostatic capacitance between the channel region and substrate is also reduced, and the threshold voltage is lowered too much.

SUMMARY OF THE INVENTION

A first object of the present invention is to provide a semiconductor device capable of reducing a drawback caused by a miniaturization due to the short channel effect or the like, and a method for manufacturing the same.

A second object of the present invention is to provide a very high-speed SOI device wherein a threshold voltage can be suitably set, a capacitance of source and drain regions is reduced, and the short channel effect is suppressed.

According to the present invention, there is provided a first SOI-type MIS semiconductor device comprising:

a pair of source and drain regions formed of high-concentration impurity and provided in a semiconductor layer which is formed on an insulation layer formed on a semiconductor substrate; and a gate electrode formed on a gate insulation layer which is formed on a channel region between the source and drain regions, wherein equipotential lines under the channel region in the insulation layer are concave, the equipotential lines being obtained when a threshold voltage is applied to the gate electrode and an operation voltage is applied between the source and drain regions.

According to the present invention, there is provided a second SOI-type MIS semiconductor device comprising:

a pair of source and drain regions formed of high-concentration impurity and provided in a semiconductor layer which is formed on an insulation layer formed on a semiconductor substrate; and a gate electrode formed on a gate insulation layer which is formed on a channel region between the source and drain regions, wherein a depletion layer in the semiconductor substrate is concave, the depletion layer being obtained when a threshold voltage is applied to the gate electrode and an operation voltage is applied between the source and drain regions.

In the first and second semiconductor device, it is desirable that the equipotential lines under the channel region in the insulation layer are concave and the depletion layer in the semiconductor substrate is concave when the threshold voltage is applied to the gate electrode and a 0V is applied between the source and drain regions.

In the first and second semiconductor device, it is desirable that impurity regions are formed under the source and drain regions in the semiconductor substrate, the impurity regions having an impurity concentration higher than an impurity concentration of the semiconductor substrate. Further, in this modification, it is desirable that the impurity regions are formed of $Si_xGe_{1-x}$ and that the semiconductor substrate is of a p-type and the source and drain regions are of an n-type.

In the first and second semiconductor device, it is desirable that the semiconductor substrate is of a p-type, the source and drain regions are of an n-type, and another regions are formed under the source and drain regions in the semiconductor substrate, the other regions being formed of a material of which top of valence band is higher than the top of valence band of the semiconductor substrate.

In the first and second semiconductor device, it is desirable that the semiconductor layer has a flat lower surface and the insulation layer comprises a first portion located under the channel region and a second portion formed under the source and drain regions which is thinner than the first portion.

In the first and second semiconductor device, it is desirable that the insulation layer comprises a first portion located under the channel region and a second portion formed under the source and the drain regions of which relative permittivity is lower than that of the first portion. Further in this modification, it is desirable that the relative permittivity of the first portion is higher than that of the silicon oxide layer and/or the relative permittivity of the second portion is lower than that of the silicon oxide layer.

According to the present invention, there is provided a first method for manufacturing a semiconductor device, comprising the steps of:

forming a semiconductor layer on a semiconductor substrate via a first insulation layer;

forming a second insulation layer on the semiconductor layer;

forming a gate electrode on the second insulation layer by patterning;

forming a high-concentration impurity region in the semiconductor substrate, by implanting ions whose conductivity type is equal to that of the semiconductor substrate, using the gate electrode as a mask, an impurity concentration of the impurity region being higher than that of the semiconductor substrate; and forming source and drain regions in the semiconductor layer by implanting ions whose conductivity type is opposite to that of the semiconductor substrate, using the gate electrode as a mask.

The first method may be modified as follows. The step of forming the high-concentration impurity region can be replace by a step of forming a region of a material of which top of valence band is higher than that of the semiconductor substrate. When the semiconductor substrate is of a p-type, the above region is formed by ion-implementing germanium into the semiconductor substrate, and the source and drain regions are formed by ion-implementing a impurity material of n-type.

According to the present invention, there is provided a second method for manufacturing a semiconductor device, comprising the steps of:

forming a first insulation layer on a semiconductor substrate;

forming a groove in the semiconductor substrate by etching the first insulation layer and the semiconductor substrate;

forming a second insulation layer in the groove and flattening upper surfaces of the first and second insulation layers;

forming a semiconductor layer on the first and second insulation layers;

forming a third insulation layer on the semiconductor layer;

forming a gate electrode on the third insulation layer by patterning; and forming source and drain regions in the semiconductor layer by implanting ions whose conductivity type is opposite to that of the semiconductor substrate, using the gate electrode as a mask.

According to the present invention, there is provided a third method for manufacturing a semiconductor device, comprising the steps of:

forming a first insulation layer on a semiconductor substrate;

etching a part of the insulation layer;

forming a first semiconductor layer, whose conductivity type is equal to that of the semiconductor substrate, in an etched portion of the insulation layer by epitaxial growth;

forming a second insulation layer on the first insulation layer and the first semiconductor layer;

forming a second semiconductor layer on the second insulation layer;

forming a third insulation layer on the second semiconductor layer;

forming a gate electrode on the third insulation layer by patterning; and forming source and drain regions in the second semiconductor layer by implanting ions whose conductivity type is opposite to that of the second semiconductor layer, using the gate electrode as a mask.

According to the present invention, there is provided a fourth method for manufacturing a semiconductor device, comprising the steps of:

forming a semiconductor layer on a semiconductor substrate via a first insulation layer;

forming a second insulation layer on the semiconductor layer;

forming a gate electrode on the second insulation layer;

forming a low permittivity region in the first insulation layer by ion-implanting fluorine into the first insulation layer using the gate electrode as a mask; and forming source and drain regions in the semiconductor layer over the low permittivity region by implanting ions whose conductivity type is opposite to that of the second semiconductor layer, using the gate electrode as a mask.

According to the first and second semiconductors, an SOI-type MISFET is constituted such that a depletion layer or equipotential lines are formed concavely. This MISFET is attained by the high-concentration region formed on the semiconductor substrate, the shape of an insulation film interposed between the semiconductor substrate and semiconductor layer, and the control of relative permittivity. The short channel effect is manifested reversely. If the optimum control is performed, the variations in threshold voltage Vth due to a reduction in channel length can be diminished. When the high-concentration region is controlled, a barrier is formed in which direction the DIBL caused in the channel region is canceled, thereby to reduce the drawback due to the DIBL and preventing the threshold voltage Vth from lowering.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a view showing the distribution of equipotential lines of the conventional SOI-type MISFET;

FIG. 5 is a view showing the shape of a depletion layer of an SOI-type MISFET according to the respective embodiments of the present invention;

FIG. 6 is a view showing the distribution of equipotential lines of the SOI-type MISFET according to the respective embodiments of the present invention;

FIG. 7 is a cross-sectional view showing the construction of an SOI-type MISFET according to a first embodiment of the present invention;

FIG. 8 is a view of the distribution of equipotential lines of the MISFET of the first embodiment;

FIG. 12 shows energy bands of a p-type semiconductor substrate of the SOI-type MISFET of the first embodiment to which the ion-implantation of germanium is applied;

FIG. 13 is a cross-sectional view showing the construction of an SOI-type MISFET according to a second embodiment of the present invention;

FIGS. 15A to 15E are views for explaining a process of manufacturing the MISFET of the second embodiment;

FIG. 16 is a graph showing the dependence of threshold voltage upon channel length in the SOI-type MISFET of the second embodiment and that in the conventional SOI-type MISFET;

FIGS. 21A and 21B are views for explaining the distribution of equipotential lines when the relative permittivity of the buried insulation film of the SOI-type MISFET of the third embodiment is changed;

FIG. 25 is a view for explaining the distribution of equipotential lines of the SOI-type MISFET of the third embodiment;

DETAILED DESCRIPTION OF THE PREFERRED EMBODIMENTS

Figure 1:
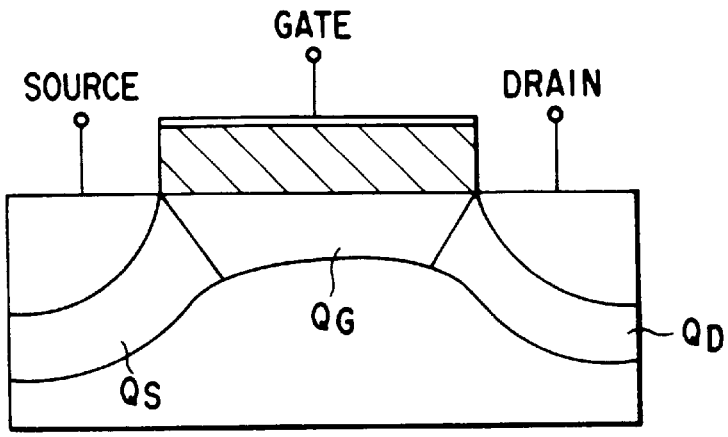
FIG. 1 is a view showing the shape of a depletion layer when a short channel effect appears in a conventional MISFET.
Figure 2:
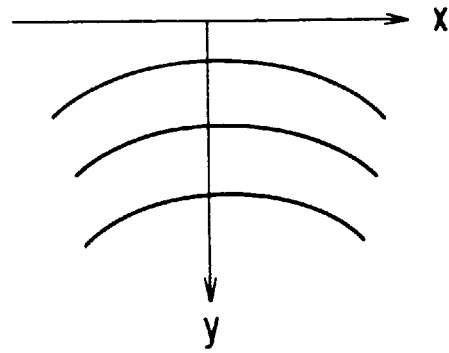
FIG. 2 is a view showing the formation of equipotential lines when a short channel effect appears in a conventional MISFET.
Figure 3:
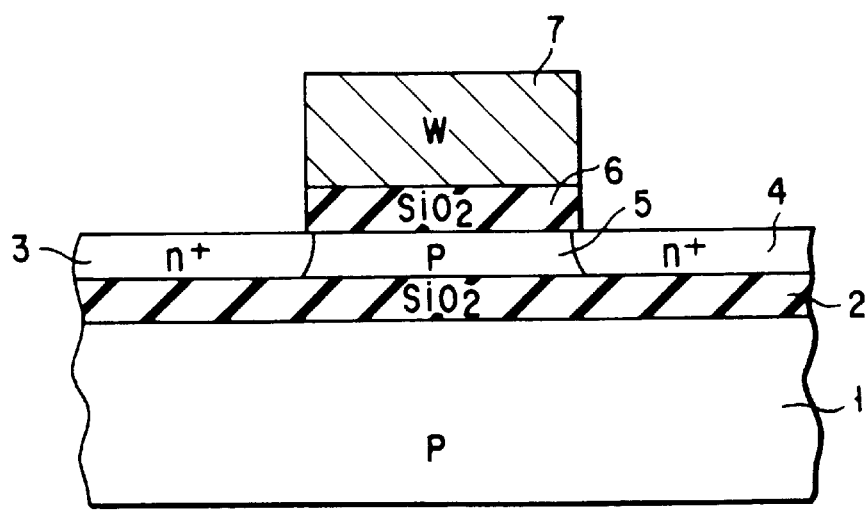
FIG. 3 is a cross-sectional view showing the construction of a conventional SOI-type MISFET.

A preferred embodiment of a semiconductor device according to the present invention will now be described with reference to the accompanying drawings.

First the basic concept of an SOI-type MISFET according to the present invention will be explained.

In the SOI-type MISFET according to the present invention, a depletion layer is formed as shown in FIG. 5 as indicated by a broken line. The depletion layer is shaped concavely in a shape of valley, while that of the conventional SOI-type MISFET is done convexly. The MISFET 10 shown in FIG. 5 has a basic structure wherein a silicon oxide film 12 as an insulation film is formed on a p-type semiconductor substrate 11. An n$^+$-type source region 13 and an n$^+$-type drain region 14 are formed on the silicon oxide film 12, and a channel region 15 is also formed thereon between the source and drain regions. A silicon oxide film 16 serving as an insulation film is formed on the channel region 15, and a gate electrode 17 is provided on the silicon oxide film 16.

The MISFET 10 is formed in such a manner that the equipotential lines are distributed concavely in the shape of valley as shown in FIG. 6. In the SOI-type MISFET of the present invention, the depletion layer or the distribution of equipotential lines is rendered concave.

A first embodiment of the present invention will now be described.

FIG. 7 is a cross-sectional view of the SOI-type MOS (Metal Oxide Semiconductor) FET (Field Effect Transistor) 100 of the first embodiment. In this SOI-type MOSFET 100, a silicon oxide film 102 as an insulation film is formed on a p-type semiconductor substrate 101. A p-type substrate (SOI layer) 110 is formed on the film 102, and n$^+$-type source and drain regions 103 and 104 are provided in the SOI layer 110. A channel region 105 is formed between the source and channel regions 103 and 104 on the silicon oxide film 102. A silicon oxide film 106 serving as an insulation film is formed on the channel region 105, and a gate electrode 107 is formed on the silicon oxide film 106. Furthermore, in the first embodiment, high-concentration p-type regions 108 and 109 are formed in the p-type semiconductor substrate 101 and under the source and drain regions 103 and 104, respectively. The conductivity type of the substrate 101 is p-type which is opposite to that of the source and drain regions 103 and 104, i.e., n-type.

FIG. 8 shows the potential distribution when the gate voltage $V_G$ and drain voltage $V_D$ of the MOSFET 100 shown in FIG. 7 are set to Vth and 0.05V, respectively. As is apparent from FIG. 8, the equipotential lines are formed concavely. The reason is as follows. The depletion layer in the high-concentration p-type regions 108 and 109, which are formed under the source and drain regions 103 and 104, does not extend much longer than that in the substrate 101 formed under the channel region 105, since the concentration of the regions 108 and 109 is high. Further, due to a difference in built-in potential caused by the high-concentration p-type regions 108 and 109, the equipotential lines are formed concavely. When the equipotential lines are distributed concavely, the threshold voltage Vth increases as the device is miniaturized (See K. Natori, I. Sasaki and F. Masuoka, "An analysis of the concave MOSFET", IEEE Trans. vol ED-25, pp448–456, 1978 and Hara, Natori, Horiuchi, "Operating Theory of MOS transistor", Kindai Kagakusya, P135). In the first embodiment, however, the variations in threshold voltage Vth due to a reduction in channel length can be lessened by optimizing the impurity concentration of the high-concentration p-type regions 108 and 109, for example, by setting the maximum of the impurity concentration to 10 to $10^4$ times as high as that of the impurity concentration of the p-type semiconductor substrate 101.

As described above, in the present invention, the short channel effect is manifested reversely by forming a high-concentration p-type region in the semiconductor substrate of the SOI-type MOSFET, and the variations in threshold voltage Vth due to a decrease in channel length can be lessened by optimizing the concentration of the p-type region. Moreover, a barrier is produced in the p-type semiconductor substrate 101 in which direction the DIBL caused in the channel region 105 is canceled, thereby eliminating a problem due to the DIBL and preventing a drop in threshold voltage Vth due to the short channel effect.

A process of manufacturing the above-described SOI-type MOSFET 100 will now be described, with reference to its cross-sectional views shown in FIGS. 9A to 9D.

Figure 9A:
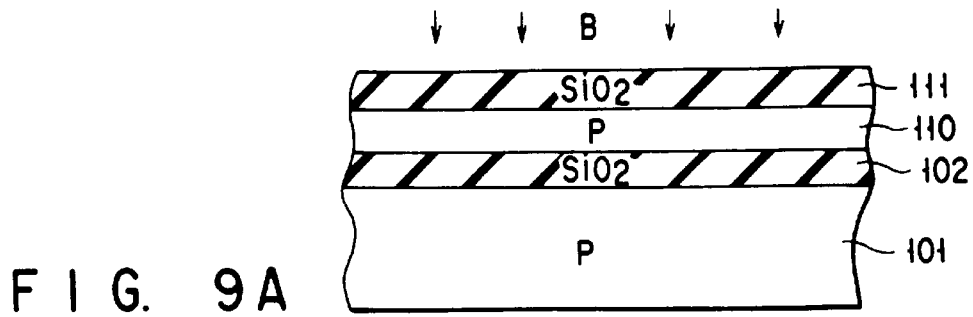
FIGS. 9A to 9D are views for explaining a process of manufacturing the MISFET of the first embodiment.
Figure 9B:
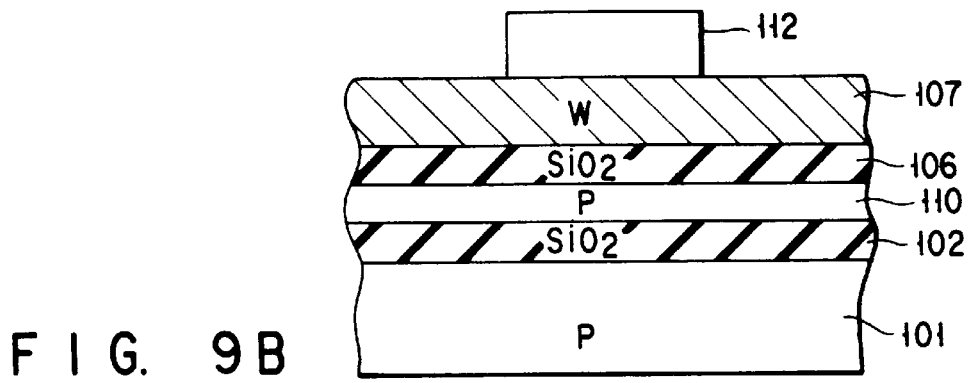
Figure 9C:
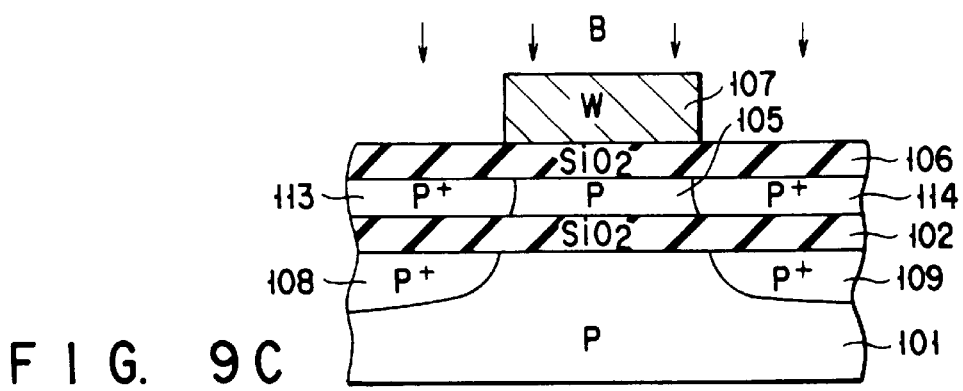
Figure 9D:
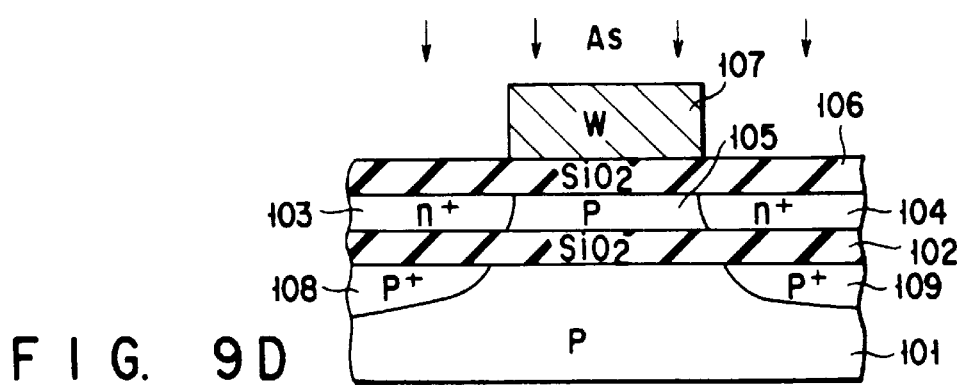

First an SOI layer of, e.g., 25 nm thickness is formed on a p-type semiconductor substrate 101 using a well-known SOI layer forming technique. According to this technique, the substrate 101 is thermally oxidized to form an oxide film 102 of 10 nm thickness and deposit a polysilicon film of 25 nm thereon. Then the polysilicon film is monocrystalized using, for example, a laser beam anneal technique to obtain the SOI layer. As shown in FIG. 9A, an oxide film 111 having 20 nm thickness is formed by thermal oxidation, and boron is ion-implanted into the SOI layer at an acceleration voltage of 30 keV and a dose of $10^{11}$ cm$^{-2}$, thus obtaining a p-type SOI layer 110. As illustrated in FIG. 9B, the oxide film 111 is removed by etching, and a gate oxide film 106 having 10 nm thickness is formed by thermal oxidation. A tungsten film 107 of 0.4 μm thickness, which is to serve as a gate electrode, is deposited on the gate oxide film 106, and a resist film 112 is formed thereon and patterned. As shown in FIG. 9C, using the patterned resist film 112 as a mask, the tungsten film 107 is patterned by plasma etching to form a gate electrode 107. After that, for example, boron is ion-implanted into the p-type semiconductor substrate 101 at an acceleration voltage of, e.g., 60 keV and a dose of, e.g., $10^{12}$ cm$^{-2}$ to form high-concentration p-type regions 108 and 109 therein. Similarly, high-concentration p-type regions 113 and 114 are formed in the p-type SOI layer 110. As shown in FIG. 9D, arsenic is ion-implanted into the SOI layer 110 at an acceleration voltage of, e.g., 15 keV and a dose of, e.g., $10^{14}$ cm$^{-2}$ to form n-type source and drain regions 103 and 104. After that, a wiring (not shown) is formed on the source and drain regions 103 and 104 thereby to complete an MOSFET.

The SOI-type MOSFET 100 as shown in FIG. 7 can be manufactured through the above-described process. In the method for manufacturing the semiconductor device according to the first embodiment, the high-concentration p-type regions 108 and 109 can be formed in the p-type semiconductor substrate 101 under the source and drain regions 103 and 104, the conductivity type of the substrate 101 (p-type) being opposite to that of the source and drain regions 103 and 104 (n-type). As a result, the short channel effect can be diminished and the DIBL can be prevented.

Figure 10:
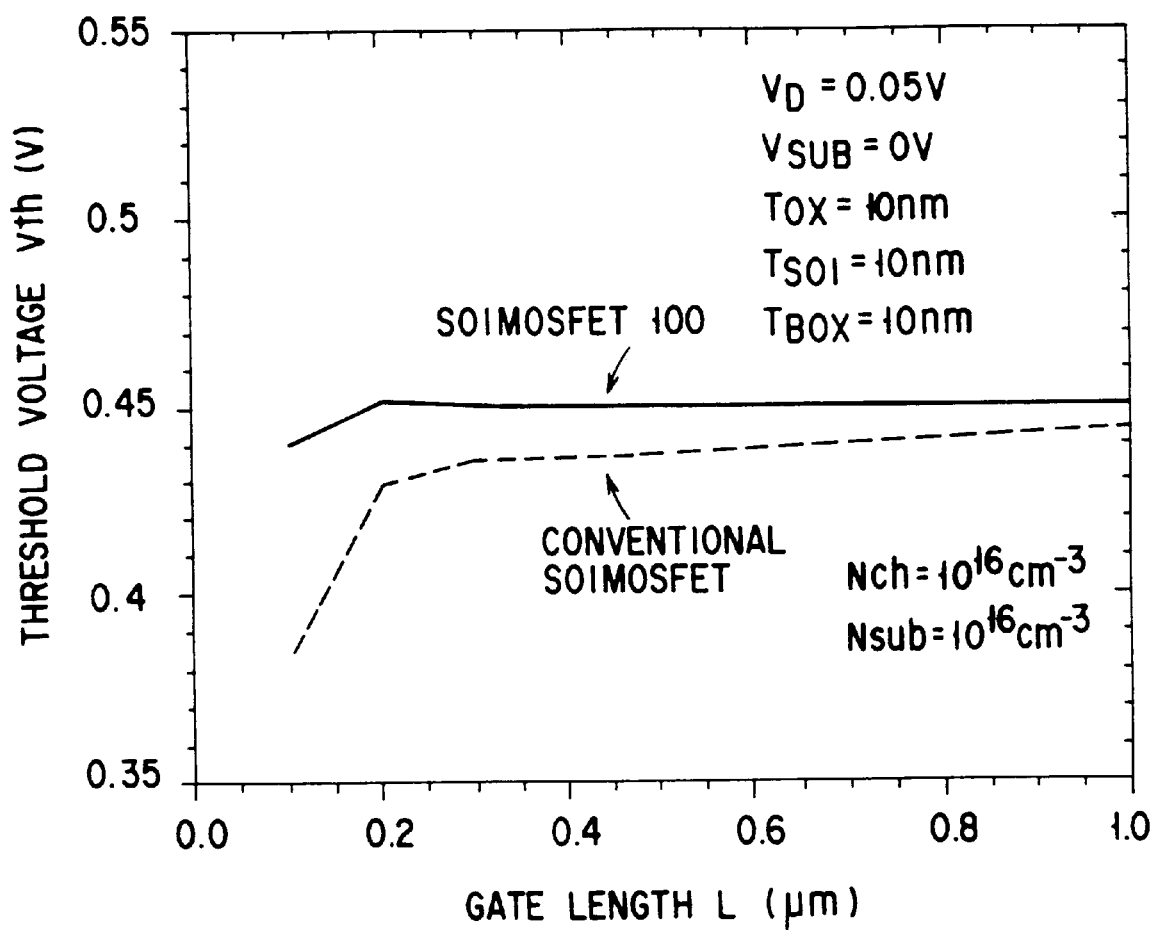
FIG. 10 is a graph showing the dependence of threshold voltage upon channel length in the SOI-type MISFET of the first embodiment and that in the conventional SOI-type MISFET.

The dependence of threshold voltage Vth upon channel length will be described with reference to FIG. 10. In FIG. 10, a solid line indicates the dependence in the SOI-type MOSFET 100 shown in FIG. 7, while a broken line does that in a conventional SOI-type MOSFET. The characteristics of the MOSFET 100 are that the thickness $T_{OX}$ of gate oxide film 106 is 10 nm, the thickness $T_{SOI}$ of SOI layer 110 is 10 nm, the thickness $T_{BOX}$ of oxide film 102 is 10 nm, the impurity concentration of n-type source and drain regions 103 and 104 is $10^{20}$ cm$^{-3}$, the impurity concentration of p-type semiconductor substrate 101 is $10^{16}$ cm$^{-3}$, and the maximum of the impurity concentration of high-concentration p-type regions 108 and 109 is $10^{18}$ cm$^{-3}$. The variations in threshold voltage Vth due to a reduction in channel length can be lessened and the short channel effect can be suppressed by forming the high-concentration p-type regions in the substrate of the SOI-type MOSFET.

A method for manufacturing an SOI-type MOSFET 100 in which $Si_xGe_{1-x}$ region is formed by ion-implantation of germanium (Ge), instead of forming the aforementioned high-concentration p-type regions 108 and 109, will now be described. The respective steps of the manufacturing method is shown in FIGS. 11A to 11D. Since the steps other than that shown in FIG. 11C are the same as the above-described steps using ion-implantation of boron and shown in FIGS. 9A, 9B and 9D, their detailed description is omitted.

Figure 11A:
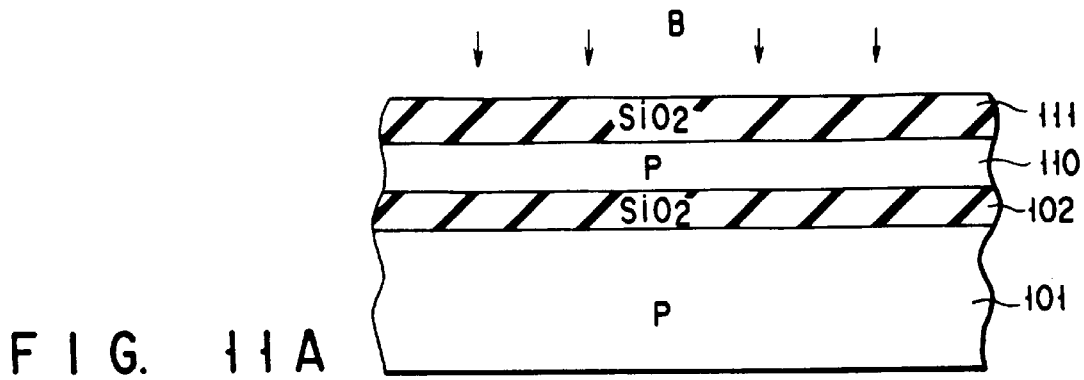
FIGS. 11A to 11D are views for explaining a process of manufacturing the SOI-type MISFET of the first embodiment, to which ion-implantation of germanium is applied.
Figure 11B:
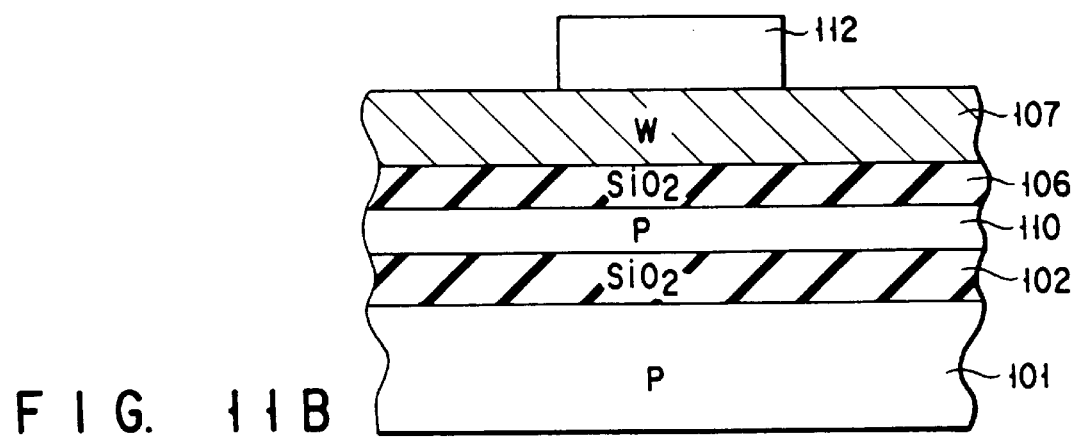
Figure 11C:
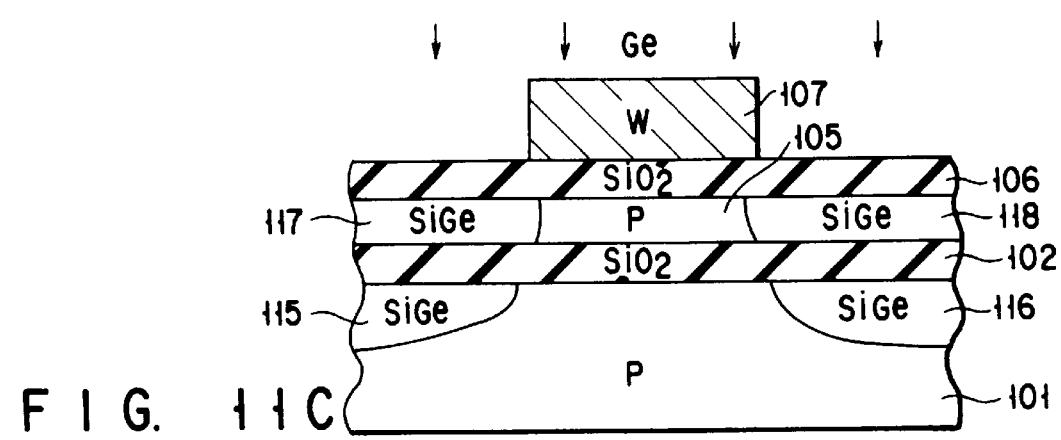

First an SOI layer is formed on a p-type semiconductor substrate 101 by the well-known SOI layer forming technique and then, as shown in FIG. 11A, a p-type SOI layer is obtained. As illustrated in FIG. 11B, a gate oxide film 106 is formed by removing the silicon oxide film 111 using etching technique, a tungsten film 107 is deposited thereon, and a resist film 112 is patterned on the tungsten film 107.

Figure 11D:
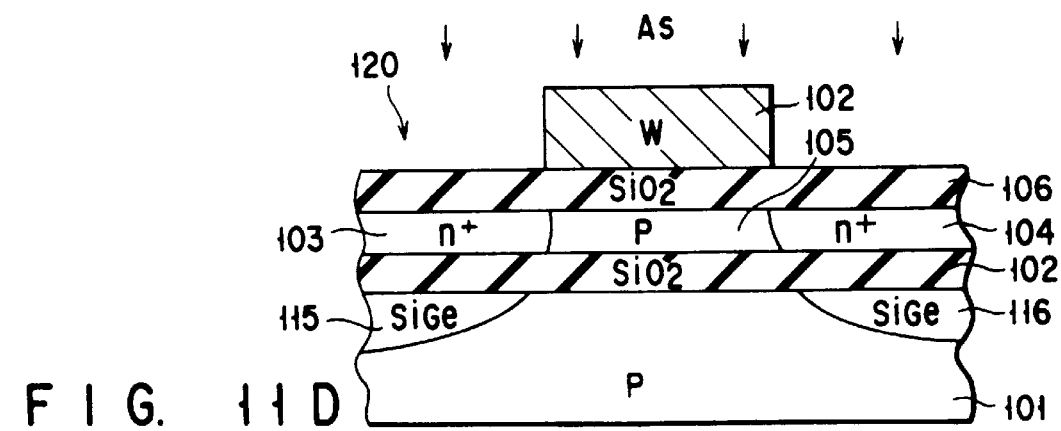

As shown in FIG. 11C, using the patterned resist film 112 as a mask, the tungsten film 107 is patterned by plasma etching to form a gate electrode. After that, germanium is ion-implanted into the p-type semiconductor substrate 101 at an acceleration voltage of, e.g., 30 keV and a dose of, e.g., $5\times10^{14}$ cm$^{-2}$ to form $Si_xGe_{1-x}$ regions 115 and 116 therein. Tin (Sn) can be used instead of germanium. Similarly, $Si_xGe_{1-x}$ regions 117 and 118 are formed in the p-type SOI layer 110. As shown in FIG. 11D, arsenic is ion-implanted into the SOI layer 110 at an acceleration voltage of, e.g., 15 keV and a dose of, e.g., $10^{14}$ cm$^{-2}$ to form n-type source and drain regions 103 and 104. After that, a wiring is formed on the source and drain regions 103 and 104 using the well-known technique to complete an SOI-type MOSFET 120.

The SOI-type MOSFET 120 as shown in FIG. 11D can be achieved through the above-described steps. In the method for manufacturing the SOI-type MOSFET 120, the $Si_xG_{1-x}$ regions 115 and 116 can be formed in the p-type semiconductor substrate 101 under the n-type source and drain regions 103 and 104, the conductivity type of the substrate 101 being opposite to that of the source and drain regions 103 and 104. In the $Si_xGe_{1-x}$ regions of the p-type semiconductor substrate 101, as shown in FIG. 12, the valence band approaches the conduction band by about 0.3 eV, with the result that a barrier is formed in the p-type semiconductor substrate 101 in which direction the DIBL caused in a channel region is canceled, and the short channel effect can be diminished.

According to the first embodiment described above, by forming the high-concentration p-type regions or the $Si_xGe_{1-x}$ regions in the semiconductor substrate of the SOI-type MOSFET, the variations in threshold voltage Vth due to a reduction in channel length can be lessened and the short channel effect can be suppressed. Since, furthermore, the depletion layer is formed in the semiconductor substrate and extends under the channel region, the S coefficient of sub-threshold characteristics can be kept small, and the drain current flowing through a sub-threshold region can be decreased.

According to the first embodiment, in the SOI-type MOSFET 100 shown in FIG. 7, the impurity concentration of high-concentration p-type regions 108 and 109 is set to $10^{18}$ cm$^{-3}$ and that of p-type semiconductor substrate 101 is set to $10^{16}$ cm$^{-3}$. However, in order to suppress the variations in threshold voltage Vth due to a reduction in channel length, the impurity concentration of high-concentration p-type regions 108 and 109 can be set to the optimum value, for example, the maximum value of the impurity concentration can be 10 to $10^4$ times as large as that of the impurity concentration of p-type semiconductor substrate 101. If the concentration of the high-concentration p-type regions is lower than the concentration ten times that of the p-type semiconductor substrate 101, the threshold voltage Vth is likely to drop. On the contrary, if the concentration of the high-concentration p-type regions is higher than the concentration $10^4$ times that of the substrate 101, the threshold voltage Vth is likely to increase. If, in this case, the thickness of the oxide film 102 is larger than 200 nm, the influence of the high-concentration p-type regions is lost, and the threshold voltage Vth is lowered in accordance with the miniaturization of the MOSFET. In other words, it is desirable that the SOI-type MOSFET 100 be formed under condition that the thickness $T_{BOX}$ of buried oxide film 102 is 200 nm or less.

If the thickness $T_{SOI}$ of the channel region 105 of the SOI layer is larger than 300 nm, an electrically neutral region is inevitably formed under the channel region 105 of the SOI layer, and the channel region 105 of the SOI layer cannot be fully depleted. If the channel region 105 of the SOI layer can be fully depleted, the characteristics of the MOSFET 100 are improved. It is thus desirable that the SOI-type MOSFET 100 be formed under condition that the thickness $T_{SOI}$ of the channel region 105 of the SOI layer 110 is 300 nm or less.

Moreover, it is desirable that the acceleration voltage of impurities in forming the n-type source and drain regions 103 and 104, should be lower than that which is required for forming the high-concentration p-type regions 108 and 109 and thus has no influence upon these regions.

According to the first embodiment, the polysilicon film is monocrystalized by the laser beam anneal technique to form an SOI layer. However, the SOI layer can be formed by using the SIMOX method in which oxygen ions are implanted into a silicon substrate. Furthermore, the first embodiment is directed to the n-channel SOI-type MOSFET; however, the present invention can also be applied to a p-channel SOI-type MOSFET. In this case, an n-type semiconductor substrate is used. It is desirable that regions formed of a material of which the bottom of conduction band is lower than that of the substrate, are formed under the source and drain regions.

Other embodiments of the semiconductor device according to the present invention will be described. The same portions as those of the first embodiment will be indicated in the same reference numerals and their detailed description will be omitted.

A second embodiment of the present invention will now be described with reference to the accompanying drawings.

FIG. 13 is a cross-sectional view of an SOI-type MOSFET 200 according to the second embodiment. In this MOSFET, a silicon oxide film 202 as an insulation film is formed on a p-type semiconductor substrate 201. An n$^+$-type source region 203 and an n$^+$-type drain region 204 are provided on the silicon oxide film 202, and a channel region 205 is also provided thereon between the source and drain regions 203 and 204. A silicon oxide film 206 as an insulation film is formed on the channel region 205, and a gate electrode 207 is formed on the oxide film 206. As is apparent from FIG. 13, the silicon oxide film (buried insulation film) 202 located under the source and drain regions 203 and 204 is thinner than a silicon oxide film 202a located under the channel region 205.

Figure 14:
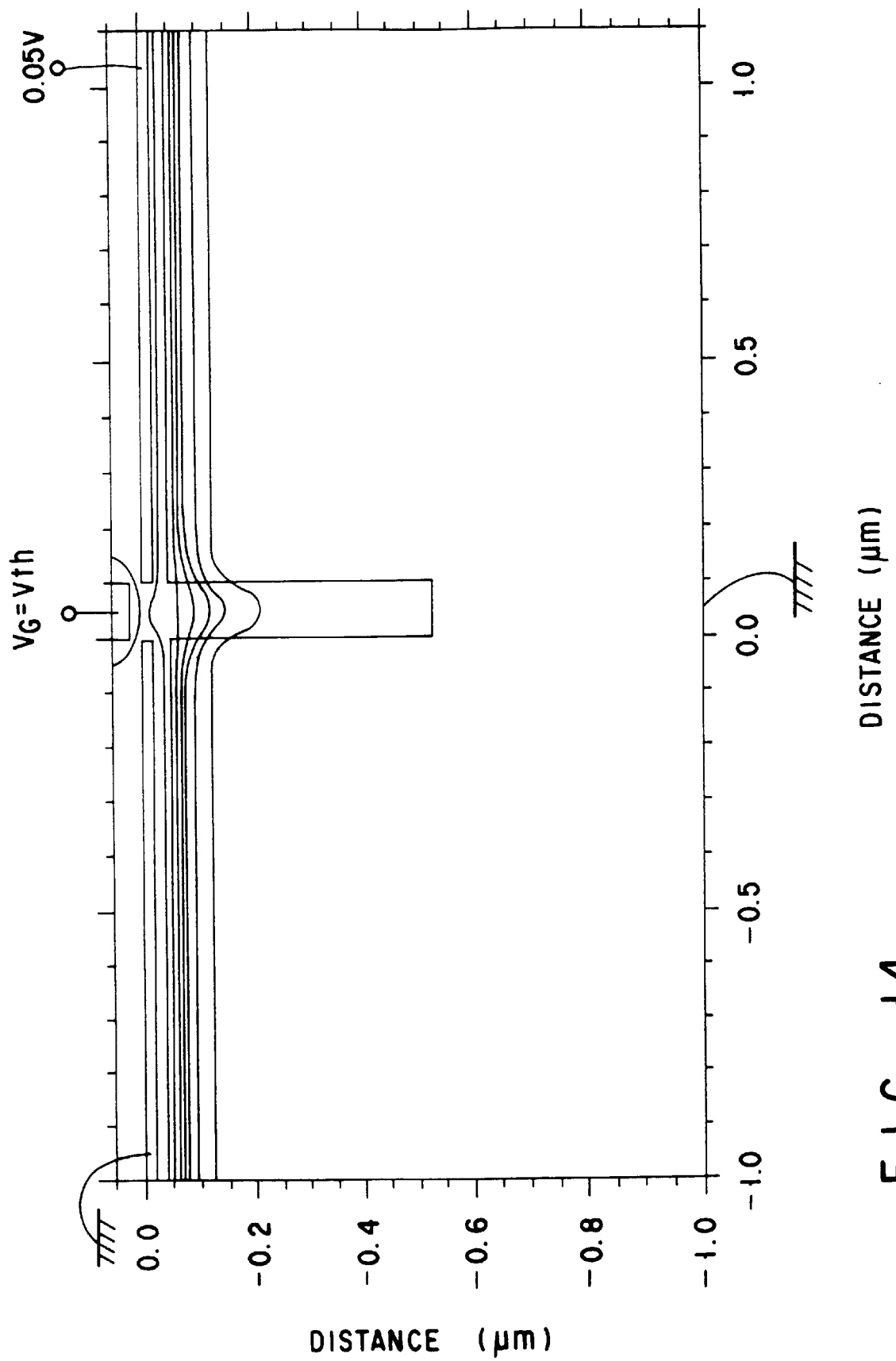
FIG. 14 is a view of the distribution of equipotential lines of the MISFET of the second embodiment.

FIG. 14 shows the potential distribution when gate voltage $V_G$ is Vth and drain voltage VD is 0.05V in the MOSFET 200 shown in FIG. 13. As is apparent from FIG. 14, the equipotential lines are formed concavely, for the buried insulation film 202 located under the source and drain regions 203 and 204 is thin, and the bottom of the buried insulation film 202a of the channel region 205 is deeper than that of a depletion layer of the semiconductor substrate 201 under the insulation layer 202.

In the convex distribution of equipotential lines, the threshold voltage Vth is decreased in accordance with a reduction in channel length, whereas, in the concave distribution thereof, it is increased (See K. Natori, I. Sasaki and F. Masuoka, "An analysis of the concave MOSFET", IEEE Trans. vol ED-25, pp448–456, 1978 and Hara, Natori, Horiuchi, "Operating Theory of MOS transistor", Kindai Kagakusya, P135). In other words, the short channel effect is manifested reversely due to the thickness of the buried insulation film 202. Therefore, the variations in threshold voltage Vth due to a reduction in channel length can be lessened by optimizing the thickness of the buried insulation film 202.

A process of manufacturing the above-described SOI-type MOSFET 200 will now be described, with reference to its cross-sectional views shown in FIGS. 15A to 15E.

First, a p-type semiconductor substrate 201 is thermally oxidized to form an oxide film 202 of 10 nm thickness and then a resist film 208 is deposited thereon. The resist film 208 is patterned by the well-known technique, as shown in FIG. 15A. By using the patterned resist film 208 as a mask, the oxide film 202 and semiconductor substrate 201 are etched by using a plasma etching technique to form a groove 209 having a depth of, e.g., 0.5 μm, as illustrated in FIG. 15B. The resist film 208 is then removed, and an oxide film of, e.g., 0.7 μm thickness is deposited on the entire surface of the resultant structure by the well-known CVD (Chemical Vapor Deposition) and, as shown in FIG. 15C, the oxide film 211 is flattened by the known CMP (Chemical Mechanical Polish), with the result that the oxide film 211 is buried into the groove 209. A silicon film is stuck on the resultant structure by the well-known sticking technique and then polished by the CMP to form an SOI layer having a thickness of 25 nm. After an oxide film 213 of 20 nm thickness is formed by thermal oxidation, boron is ion-implanted at an acceleration voltage of 30 keV and a dose of $10^{11}$ cm$^{-2}$ and, as shown in FIG. 15D, a p-type SOI layer 212 is formed. The oxide film 213 is removed by etching, and a gate oxide film 206 of 10 nm thickness is formed by thermal oxidation. A tungsten film of 0.4 μm thickness is deposited on the gate oxide film 206 to form a gate electrode 207 by the well-known patterning technique. As illustrated in FIG. 15E, arsenic is ion-implanted at an acceleration voltage of, e.g., 15 keV and a dose of, e.g., $10^{14}$ cm$^{-2}$ to form source and drain regions 203 and 204. After that, a wiring is formed by the well-known technique to complete the MOSFET 200.

The SOI-type MOSFET 200, which is shown in FIG. 13 as the second embodiment of the present invention, can be achieved through the process described above. In this process, the buried insulation film (silicon oxide film) 202 under the source and drain regions 203 and 204 can be made thinner than the buried insulation film 202a under the channel region 205, with the result that the short channel effect can be diminished.

FIG. 16 shows the dependence of threshold voltage Vth upon channel length. In FIG. 16, a solid line indicates the dependence in the SOI-type MOSFET 200 of the second embodiment, while a broken line does that in a conventional SOI-type MOSFET. The characteristics of the MOSFET 200 are that the thickness $T_{OX}$ of gate oxide film 206 is 10 nm, the thickness $T_{SOI}$ of SOI layer 210 is 10 nm, the thickness of buried insulation film (silicon oxide film) 202 under the source and drain regions 203 and 204 is 10 nm, the thickness of buried insulation film 202a under the channel region is 0.5 μm, the impurity concentration of the SOI layer is $10^{17}$ cm$^{-3}$, and the impurity concentration of p-type semiconductor substrate 201 is $10^{17}$ cm$^{-3}$. With respect to the conventional MOSFET indicated by the broken line, the thickness of the buried oxide film of the source and drain regions is 0.5 μm which is the same as that of the buried oxide film of the channel region. As is apparent from FIG. 16, if the buried insulation film 202 is decreased in thickness, the variations in threshold voltage Vth due to a reduction in channel length can be lessened and the short channel effect can be suppressed.

Another method for manufacturing the SOI-type MOSFET 200 will be described with reference to FIGS. 17A to 17E. In this method, a semiconductor film, which is located under the source and drain region, is epitaxially grown using the thin-film growing technique and thus increased in thickness.

Figure 17A:
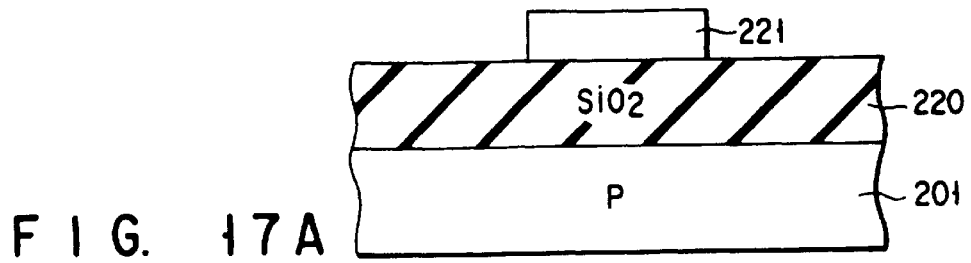
FIGS. 17A to 17E are views for explaining a process of manufacturing the SOI-type MISFET of the second embodiment, using a thin-film forming technique.
Figure 17B:
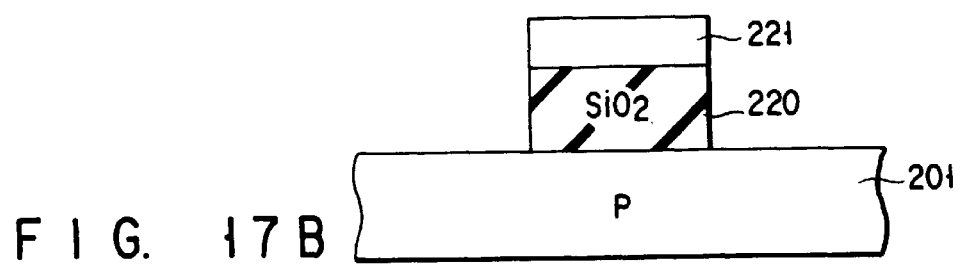
Figure 17C:
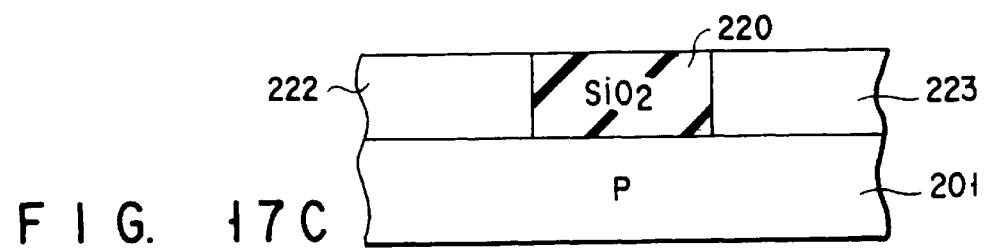
Figure 17D:
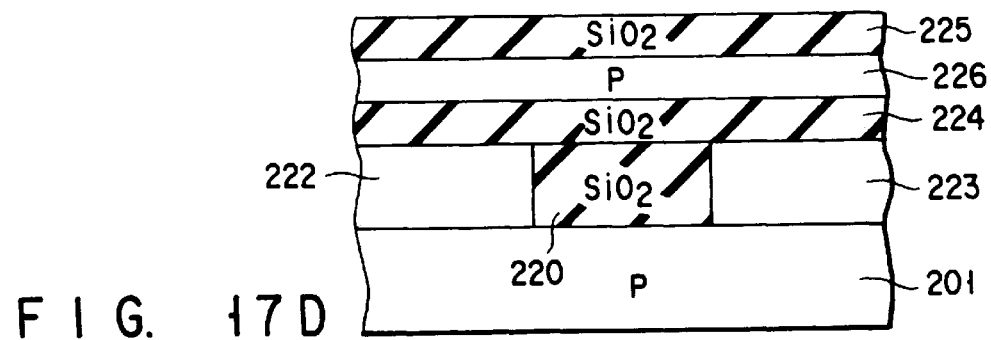
Figure 17E:
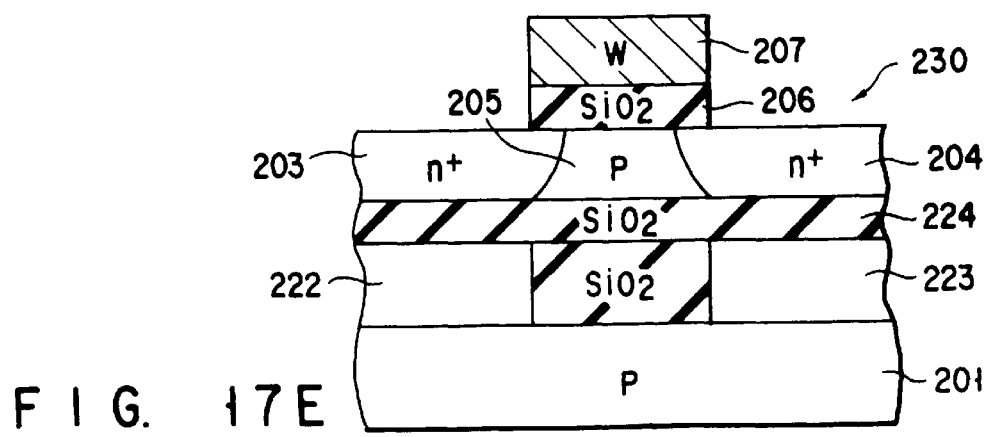

First an oxide film 220 of, e.g., 0.5 μm thickness is deposited on the entire surface of a p-type semiconductor substrate 201 by the CVD method, and a resist film 221 is deposited thereon. As shown in FIG. 17A, the resist film 221 is patterned by the well-known technique. As shown in FIG. 17B, the oxide film 220 is etched by plasma etching using the patterned resist film 221 as a mask. The resist film 221 is removed and, as shown in FIG. 17C, p-type silicon layers 222 and 223 are formed by the known epitaxial growth technique. After that, an oxide film 224 of, e.g., 50 nm thickness is deposited on the entire surface of the resultant structure by the CVD method and then flattened by the CMP method, and a silicon film is stuck by the well-known sticking technique. Then the silicon film is polished by the CMP to form an SOI layer having a thickness of 25 nm. After an oxide film 225 of 20 nm thickness is formed by thermal oxidation, boron is ion-implanted at an acceleration voltage of 30 keV and a dose of $10^{11}$ cm$^{-2}$ and, as shown in FIG. 17D, a p-type SOI layer 226 is formed. The oxide film 225 is removed by etching, and a gate oxide film 206 of 10 nm thickness is formed by thermal oxidation. A tungsten film of 0.4 $\mu$m is deposited on the gate oxide film 206 to form a gate electrode 207 by the well-known patterning technique. As illustrated in FIG. 17E, arsenic is ion-implanted at an acceleration voltage of, e.g., 15 keV and a dose of, e.g., $10^{14}$ cm$^{-2}$ to form source and drain regions 203 and 204. After that, a wiring is formed by the well-known technique to complete an SOI-type MOSFET 230, as shown in FIG. 17E.

The SOI-type MOSFET 230, which is shown in FIG. 17E as the second embodiment of the present invention, can be obtained through the process described above. In this MOSFET 230, since the buried insulation film located under the source and drain regions 203 and 204 can be made thinner than that located under the channel region 205, the short channel effect can be diminished.

If high-concentration boron is doped during the epitaxial growth, the concentration of epitaxial regions 222 and 223 can be enhanced, with the result that the short channel effect can be diminished further. If, moreover, germanium is doped during the epitaxial growth, the epitaxial regions 222 and 223 can be formed as $Si_xGe_{1-x}$. Therefore, the DIBL is suppressed and the short channel effect can be diminished further.

As described above, according to the second embodiment, the buried insulation film (silicon oxide film) 202 formed under the source and drain regions 203 and 204 can be made thinner than the buried insulation film 202a formed under the channel region 205, as illustrated in FIG. 13. Consequently, the short channel effect can be reduced.

According to the second embodiment of the present invention, the thickness $T_{SOI}$ of the SOI layer 210 shown in FIG. 13 is 10 nm. However, in order to suppress the variations in threshold voltage Vth due to a reduction in channel length, the potential of the buried insulation film needs to have an influence upon that of the surface of the channel region and thus the SOI layer 210 has to be fully depleted. If the thickness $T_{SOI}$ of the SOI layer 210 is larger than 300 nm, an electrically neutral region is inevitably formed in the channel region 205 of the SOI layer 210, and the channel region 205 of the SOI layer 210 cannot be fully depleted. It is thus desirable that the SOI-type MOSFET 200 be formed under condition that the thickness $T_{SOI}$ of the channel region 205 of the SOI layer 210 is 300 nm or less.

Furthermore, the second embodiment is directed to the n-channel SOI-type MOSFET; however, the present invention can be similarly applied to a p-channel SOI-type MOSFET.

A third embodiment of the present invention will now be described with reference to the accompanying drawings.

Figure 18A:
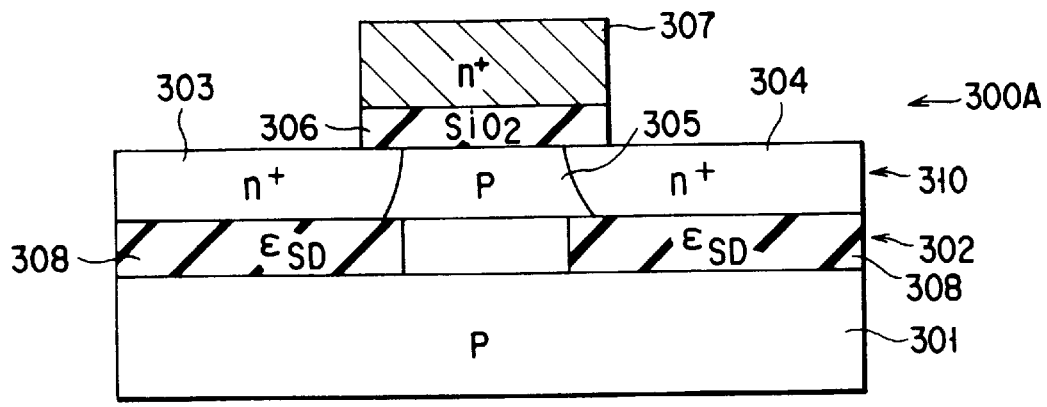
FIGS. 18A to 18C are cross-sectional views showing the construction of an SOI-type MISFET according to a third embodiment of the present invention.
Figure 18B:
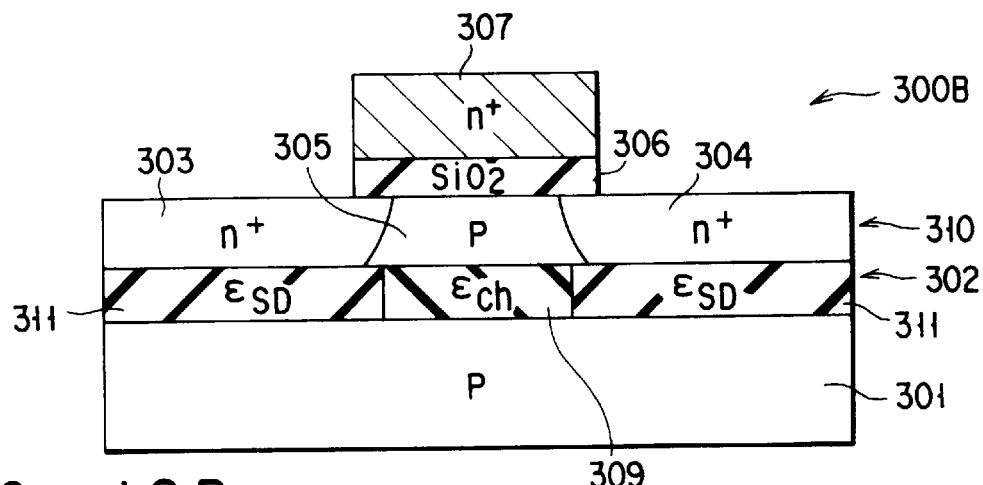
Figure 18C:
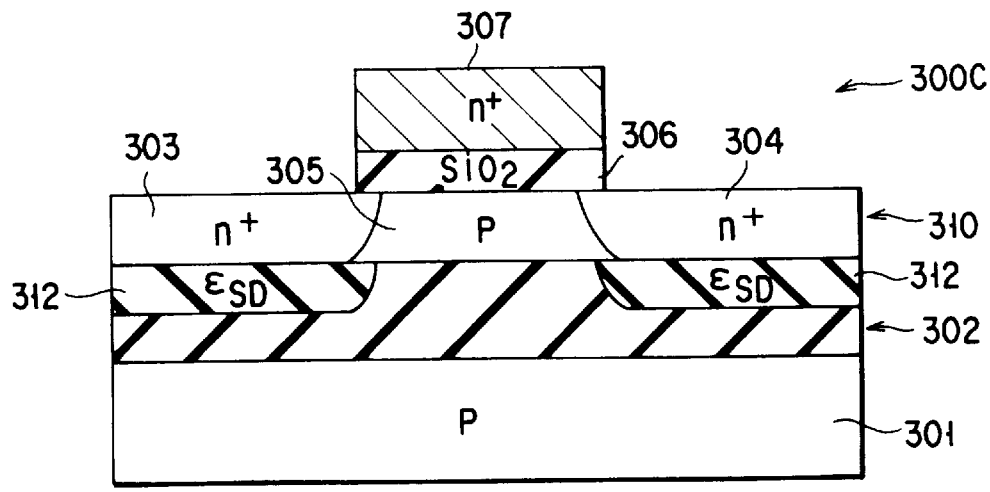

FIGS. 18A to 18C illustrate SOI-type MOSFETs 300A to 300C, respectively, according to the third embodiment. In these MOSFETs, a silicon oxide film 302 is formed on a p-type semiconductor substrate 301. The thickness of the silicon oxide film 302 is, for example, 20 nm. An n$^+$-type source region 303 and an n$^+$-type drain region 304 are provided on the silicon oxide film 302, and a channel region 305 is also provided thereon between the source and drain regions 303 and 304. A thickness of the SOI film is, for example, 10 nm. A silicon oxide film 306 as an insulation film is formed on the channel region 305, and a gate electrode 307 is formed on the oxide film 306. In the MOSFET 300A shown in FIG. 18A, a low relative permittivity region ($\epsilon_{SD}$) 308 is formed in the insulation film 302 and under the source and drain regions 303 and 304. In the MOSFET 300B shown in FIG. 18B, a high relative permittivity region ($\epsilon_{ch}$) 309, whose relative permittivity is higher than a relative permittivity ($\epsilon_{SD}$) of the insulation layer 311 under the source and drain regions, is formed in the insulation film 302 and under the channel region 305. In the MOSFET 300C shown in FIG. 18C, a low relative permittivity region ($\epsilon_{SD}$) 312 is partly formed in the insulation film 302 and under the source and drain regions 303 and 304.

Figure 19A:
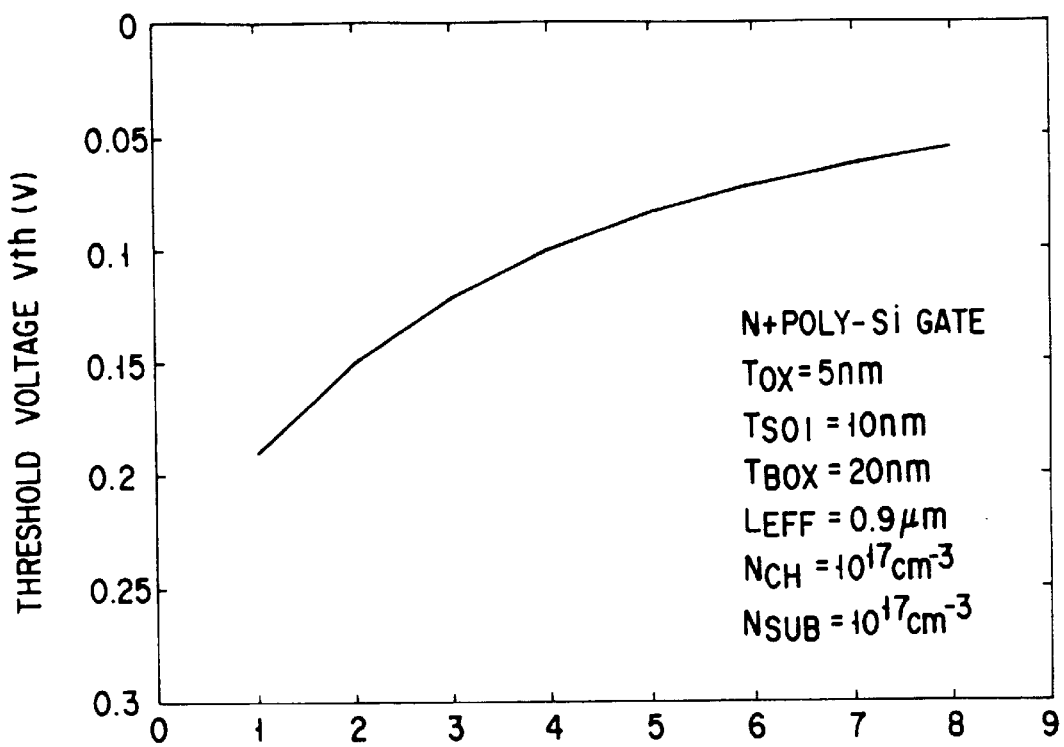
FIG. 19A is a graph showing the relationship between the relative permittivity of an insulation film formed under a channel region of the MISFET of the third embodiment and the threshold voltage of the MISFET of the third embodiment.

FIG. 19A is a graph showing the relationship between the relative permittivity of the insulation film under the channel region of the SOI-type MOSFET and the threshold voltage. The gate electrode of this MOSFET is formed of an n$^+$-type polysilicon. The threshold voltage can be set to an arbitrary value by changing a relative permittivity of the insulation layer under the channel region. The impurity concentration Nch of the channel region is set to a fixed value of $10^{17}$ cm$^{-3}$, as is the impurity concentration Nsub of the semiconductor substrate. If the relative permittivity of the insulation film under the channel region is increased, the threshold voltage is also increased, with the result that the impurity concentration of the channel region can be lowered. The mobility can thus be prevented from decreasing, and a very high-speed thin-film SOI device can be achieved.

Figure 19B:
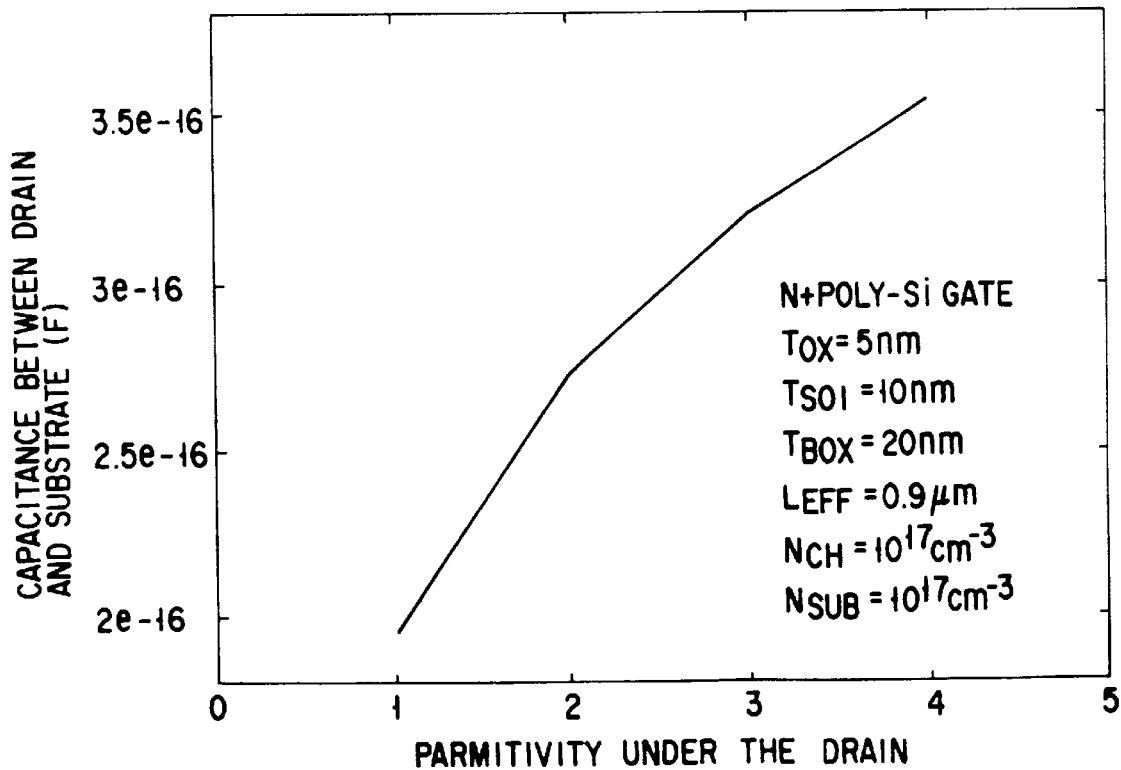
FIG. 19B is a graph showing the relationship between the relative permittivity of an insulation film formed under source and drain regions of the MISFET shown in FIGS. 18A to 18C and the capacitance of the source and drain regions.

FIG. 19B is a graph showing the relationship between the relative permittivity of an insulation film formed under the source and drain regions and the electrostatic capacitance of these regions. If the relative permittivity under the source and drain regions is decreased, the capacitance is reduced. Since the speed of the device is in inverse proportion to the electrostatic capacitance, if the relative permittivity is decreased, a very high-speed thin-film SOI can be achieved.

Figure 20:
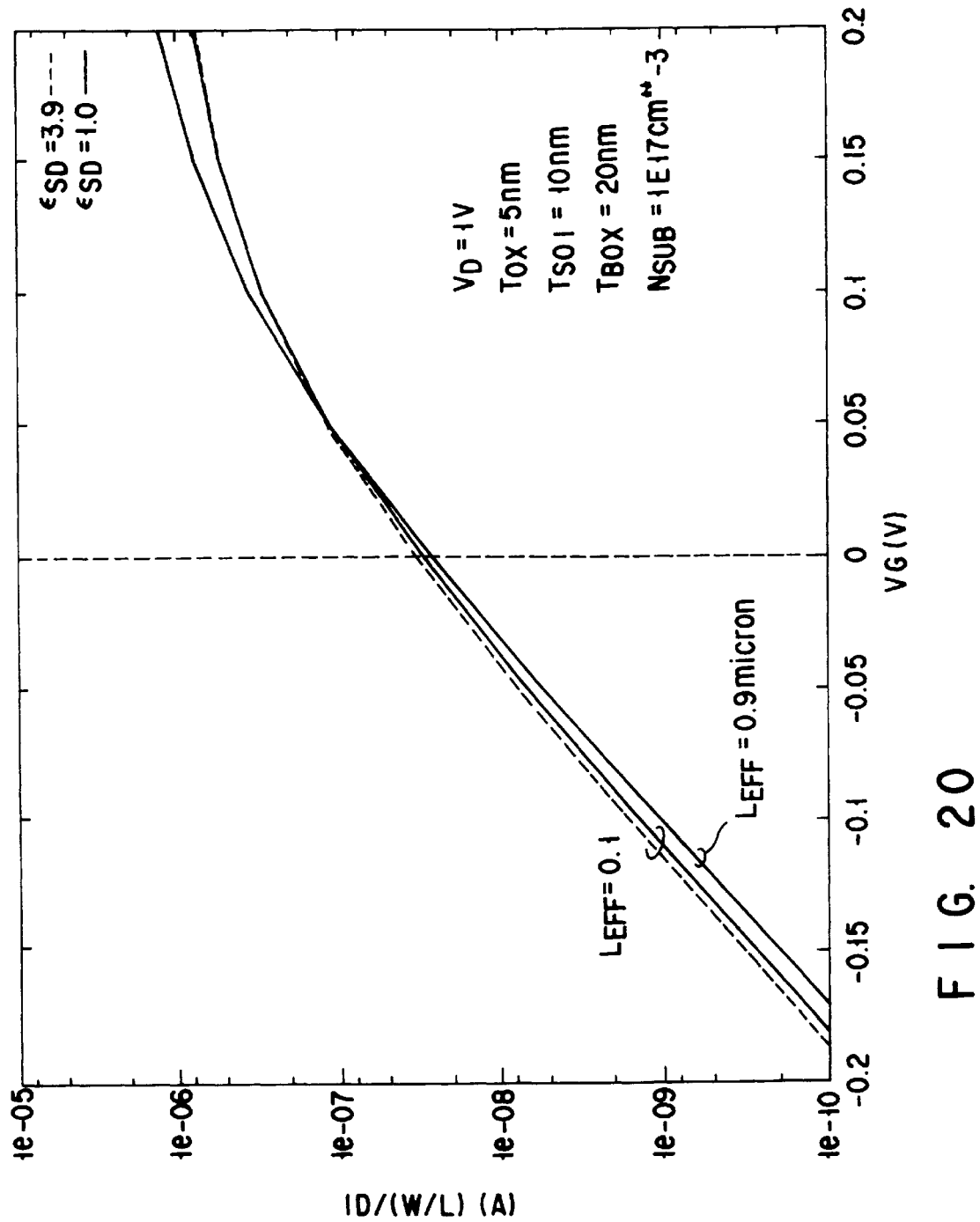
FIG. 20 is a graph showing the relationship between the relative permittivity of the buried insulation film and the short channel effect of the MISFET of the third embodiment.

FIG. 20 shows the relationship between the relative permittivity of the insulation film located under the source and drain regions of the SOI-type MOSFET and the short channel effect. If, in this case, the relative permittivity is decreased ($\epsilon_{SD}$=1.0) as indicated by the solid line, the amount of variations in threshold voltage when the effective gate length is reduced, becomes smaller than that when the insulation film has the same relative permittivity as that of the silicon oxide ($\epsilon_{SD}$=3.9), as indicated by the broken line. In other words, the short channel effect is suppressed.

The reason the short channel effect is suppressed is as follows.

FIGS. 21A and 21B show the potential distribution of the SOI-type MOSFET. FIG. 21A illustrates the potential distribution when the relative permittivity $\epsilon_{SD}$ of the insulation film under the source and drain regions is 1.0, while FIG. 21B does the potential distribution when the relative permittivity $\epsilon_{SD}$ of the insulation film formed under the source and drain regions is 3.9 which is equal to that of the silicon oxide.

In FIG. 21B, the equipotential lines are curved convexly. In FIG. 21A, they become almost flat, because the relative permittivity of the insulation film under the source and drain regions is low and thus a depletion layer is prevented from extending under the source and drain regions. The more convexly the equipotential lines are formed, the more remarkably the short channel effect is increased. On the contrary, the more flatly they are formed, the more greatly it is suppressed (See K. Natori, I. Sasaki and F. Masuoka, "An analysis of the concave MOSFET", IEEE Trans. vol ED-25, pp448–456, 1978 and Hara, Natori, Horiuchi, "Operating Theory of MOS transistor", Kindai Kagakusya, P135). Therefore, if the relative permittivity $\epsilon_{SD}$ of the insulation film under the source and drain regions is low, the short channel effect is suppressed.

When a silicon oxide film is used for the insulation film, the relative permittivity can be changed by introducing impurities into the silicon oxide film. If the silicon oxide layer is doped with fluorine, its relative permittivity is decreased. If an element other than fluorine is doped, the relative permittivity is increased.

A method for manufacturing the SOI-type MOSFET 300A shown in FIG. 18A, will be described, with reference to FIGS. 22A to 22C.

Figure 22A:
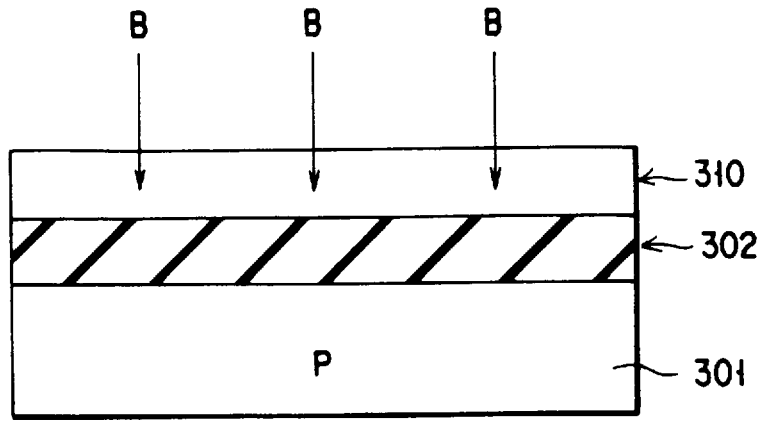
FIGS. 22A to 22C are views for explaining a process of manufacturing the SOI-type MISFET of the third embodiment.
Figure 22B:
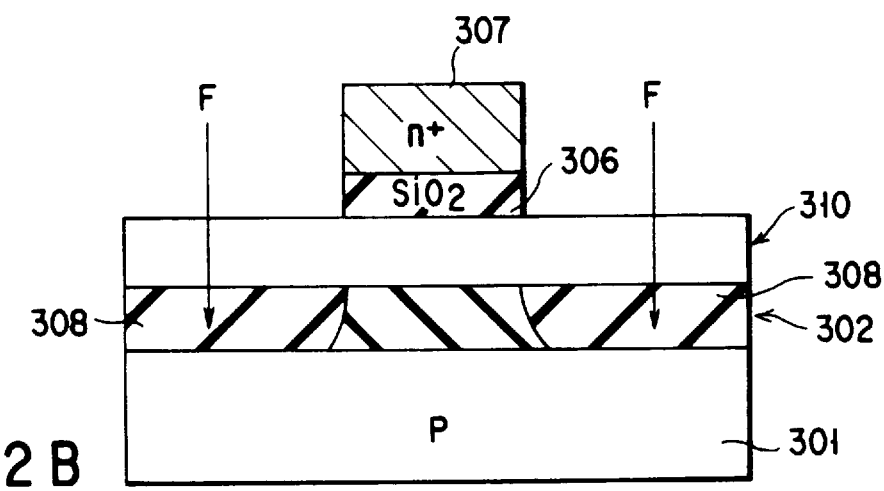
Figure 22C:
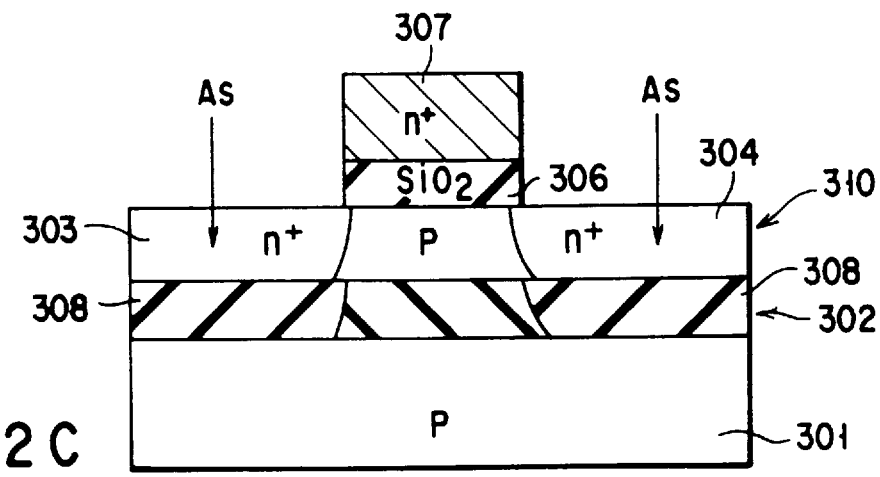

As is shown in FIG. 22A, boron is ion-implanted into an SOI layer 310, which serves as an SOI substrate and is manufactured by forming a buried insulation film 302 by a silicon oxide, at an acceleration voltage of 2 keV and a dose of $2 \times 10^{12}$ cm$^{-2}$ by the well-known ion implantation method. The surface of the SOI layer 310 is thermally oxidized at a temperature of 850° C. for twenty minutes to form a gate oxide film 306, and polysilicon containing phosphorus and having a thickness of 0.4 $\mu$m thickness is deposited on the film 306 by the CVD (Chemical Vapor Deposition) to form a gate electrode 307. The resultant construction is patterned by lithography. After that, as shown in FIG. 22B, fluorine is ion-implanted into the insulation film 302 at an acceleration voltage of 10 keV and a dose of $1 \times 10^{15}$ cm$^{-2}$ to form a low relative permittivity region 308. Thereafter, as shown in FIG. 22C, arsenic is ion-implanted into the SOI layer 310 at an acceleration voltage of 2 keV and a dose of $10^{14}$ cm$^{-2}$ to form source and drain regions 303 and 304. The impurities are heated at a temperature of 850° C. for five minutes, and a wiring is formed by the well-known technique. The SOI-type MOSFET 300A as shown in FIG. 18A can be achieved through the process described above.

A method for manufacturing the SOI-type MOSFET 300B shown in FIG. 18B, will now be described, with reference to FIGS. 23A to 23D.

Figure 23A:
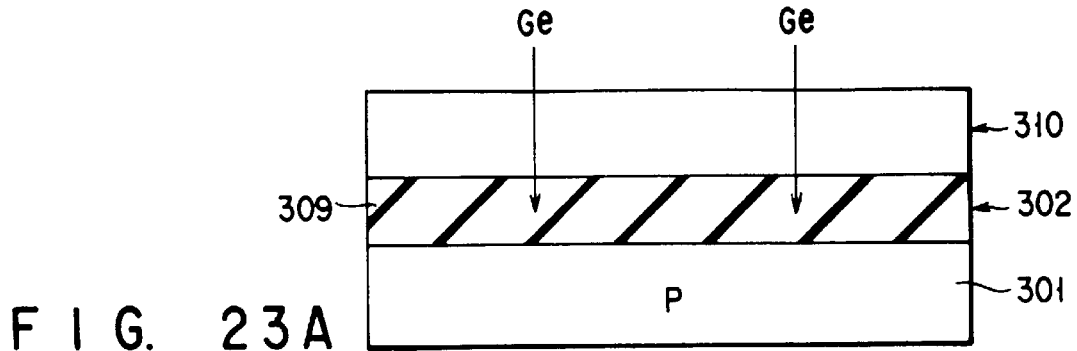
FIGS. 23A to 23D are views for explaining a process of manufacturing the SOI-type MISFET of the third embodiment.
Figure 23B:
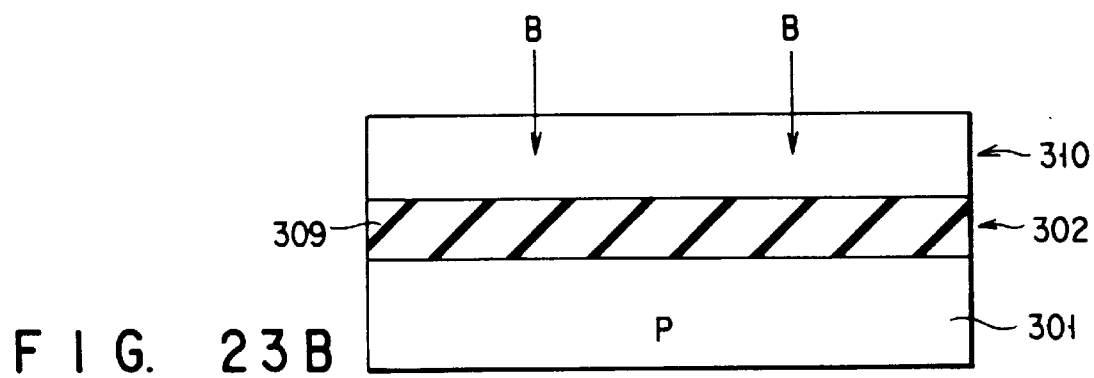
Figure 23C:
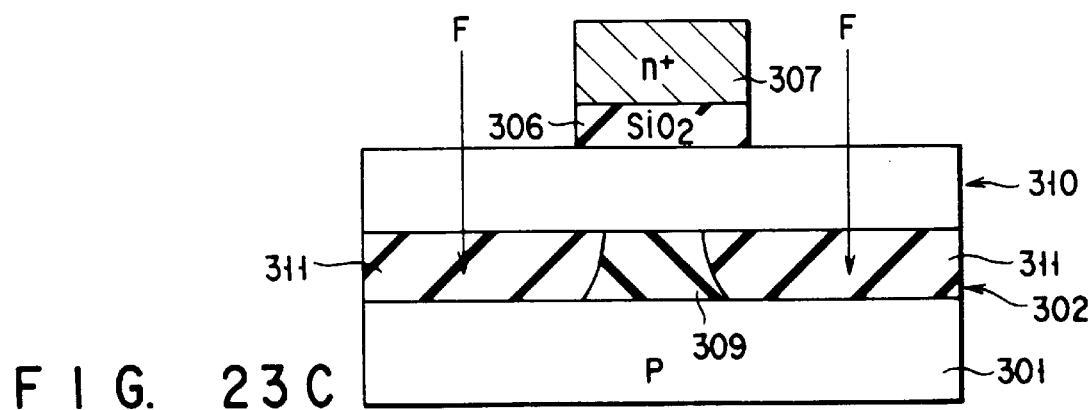
Figure 23D:
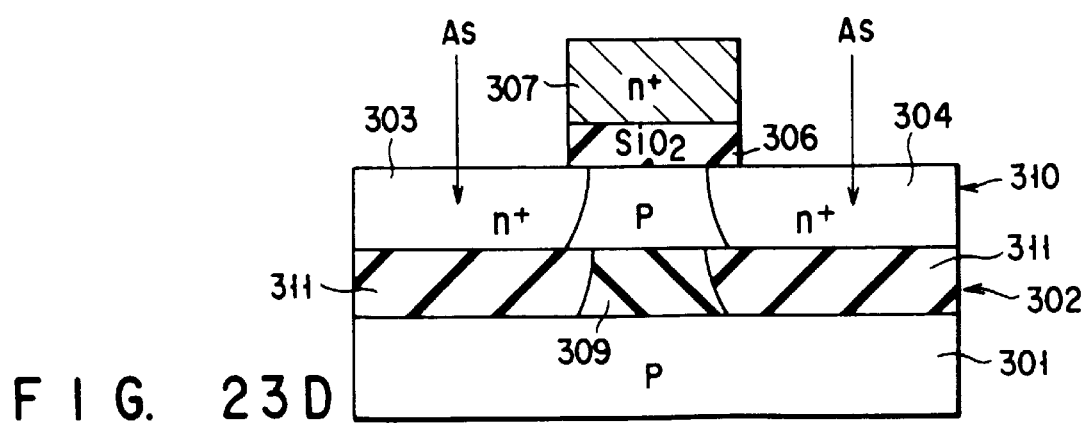

As shown in FIG. 23A, germanium is ion-implanted into an SOI layer 310, which serves as an SOI substrate and is manufactured by forming an insulation film 302 by a silicon oxide, at an acceleration voltage of 40 keV and a dose of $10^{14}$ cm$^{-2}$ to form a high relative permittivity region 309 in the insulation film 302. As shown in FIG. 23B, boron is ion-implanted into the SOI layer 310 at an acceleration voltage of 2 keV and a dose of $2 \times 10^{12}$ m$^{-2}$. The surface of the SOI layer 310 is thermally oxidized at a temperature of 850° C. for twenty minutes to form a gate oxide film 306, and polysilicon containing phosphorus and having a thickness of 0.4 $\mu$m is deposited on the film 306 by the CVD to form a gate electrode 307. The resultant construction is patterned by lithography. After that, as shown in FIG. 23C, fluorine is ion-implanted into the insulation film 302 at an acceleration voltage of 10 keV and a dose of $1 \times 10^{15}$ cm$^{-2}$ to form a low relative permittivity region 311. Thereafter, as shown in FIG. 23D, arsenic is ion-implanted into the SOI layer 310 at an acceleration voltage of 2 keV and a dose of $10^{14}$ cm$^{-2}$ to form source and drain regions 303 and 304. The impurities are heated at a temperature of 850° C. for five minutes, and a wiring is formed by the well-known technique. The SOI-type MOSFET 300B as shown in FIG. 18B can be achieved through the process described above.

A method for manufacturing the SOI-type MOSFET 300C shown in FIG. 18C, will now be described, with reference to FIGS. 24A to 23C.

Figure 24A:
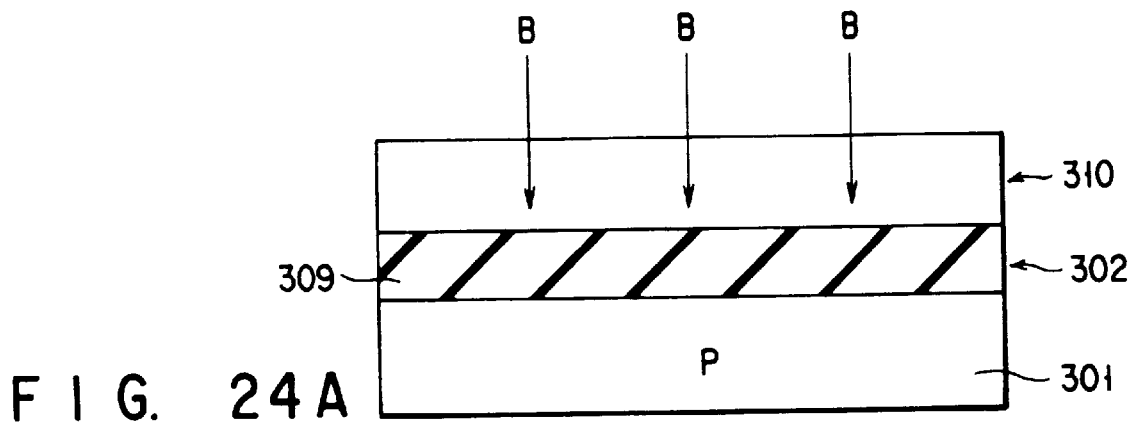
FIGS. 24A to 24C are views for explaining a process of manufacturing the SOI-type MISFET of the third embodiment.
Figure 24B:
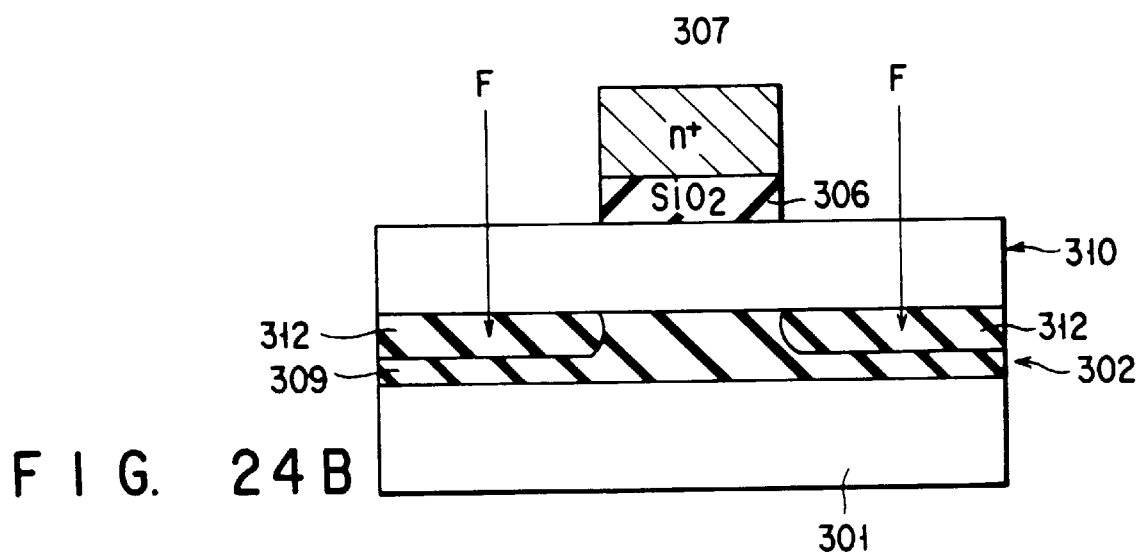
Figure 24C:
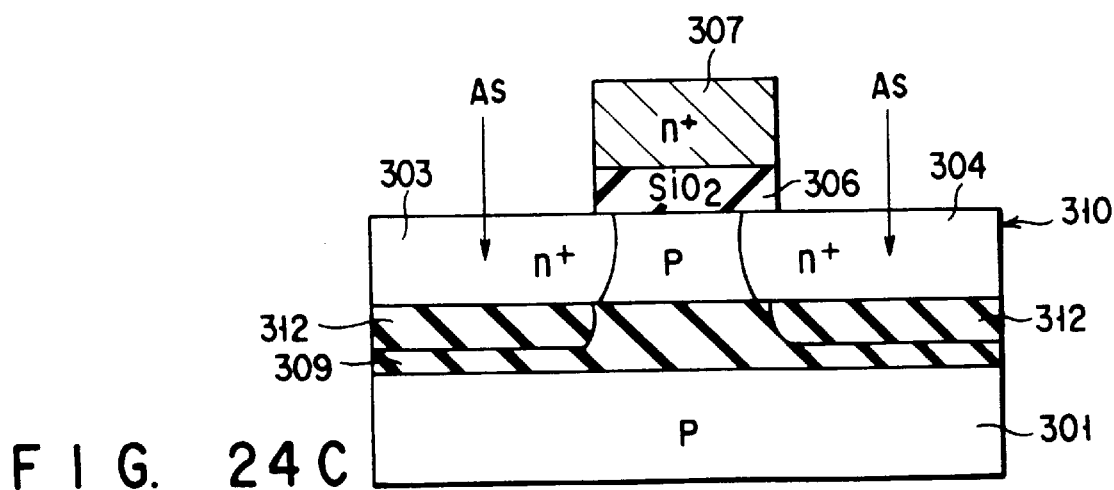

As shown in FIG. 24A, boron is ion-implanted into an SOI layer 310, which serves as an SOI substrate and is manufactured by forming an insulation film 302 by a silicon oxide, at an acceleration voltage of 2 keV and a dose of $2 \times 10^{12}$ cm$^{-2}$. The surface of the SOI layer 310 is thermally oxidized at a temperature of 850° C. for twenty minutes to form a gate oxide film 306, and polysilicon containing phosphorus and having a thickness of 0.4 $\mu$m is deposited on the film 306 by the CVD to form a gate electrode 307. The resultant structure is patterned by lithography. After that, as shown in FIG. 24B, fluorine is ion-implanted into the insulation film 302 at an acceleration voltage of 5 keV and a dose of $1 \times 10^{15}$ cm$^{-2}$ to form a low relative permittivity region 312. Thereafter, as shown in FIG. 24C, arsenic is ion-implanted into the SOI layer 310 at an acceleration voltage of 2 keV and a dose of $10^{14}$ cm$^{-2}$ to form source and drain regions 303 and 304. The impurities are heated at a temperature of 850° C. for five minutes, and a wiring is formed by the well-known technique. The SOI-type MOSFET 300C as shown in FIG. 18C can be achieved through the process described above.

According to the third embodiment described above, a very high-speed SOI device can be provided wherein the threshold voltage can be properly set, the source and drain capacitances are reduced, and the short channel effect can be suppressed. For example, in the SOI-type MOSFET 300B shown in FIG. 18B, when $\epsilon_{SD}$ is 1 and $\epsilon$ch is 3.9, the potential distribution is obtained as illustrated in FIG. 25. It is apparent from FIG. 25 that the equipotential distribution is formed concavely in the shape of valley. In the convex distribution of equipotential lines, the threshold voltage Vth is decreased in accordance with a reduction in channel length, whereas, in the concave distribution thereof, it is increased (See K. Natori, I. Sasaki and F. Masuoka, "An analysis of the concave MOSFET", IEEE Trans. vol ED-25, pp448–456, 1978 and Hara, Natori, Horiuti, "Operating Theory of MOS transistor", Kindai Kagakusya, P135). Thus, the short channel effect is manifested reversely due to the relative permittivity of the buried insulation film. Therefore, the variations in threshold voltage Vth due to a reduction in channel length can be lessened by optimizing the relative permittivity of the buried insulation film. Furthermore, it is possible to eliminate the drawback of preventing an increase in mobility, such as adjustment of threshold voltage by increasing the impurity concentration of the channel region, which is the significant feature of the thin-film SOI device.

The third embodiment is directed to the n-channel SOI-type MOSFET. However, it is needless to say that the present invention can be applied to a p-channel SOI-type MOSFET.

In the above first to third embodiments, an MOSFET is described. However, the present invention can be applied to an MISFET (Metal-Insulator-Semiconductor Field Effect Transistor) in which a silicon nitride layer, a laminated film layer formed of silicon oxide layer and a silicon nitride layer, or an insulation layer such as a silicon oxy-nitride layer is used instead of the silicon layer of the MOSFET.

Figure 26A:
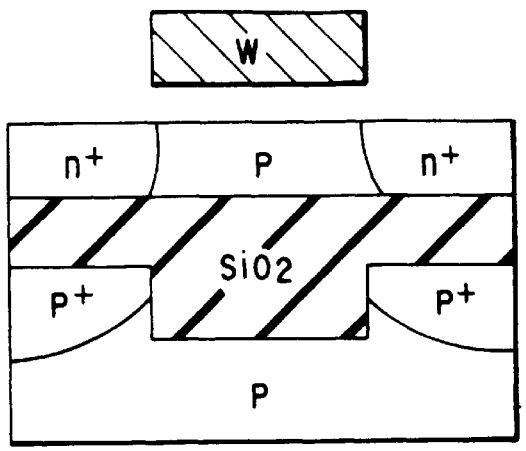
FIGS. 26A and 26B are cross-sectional views showing the construction of an SOI-type MISFET obtained by combination of the SOI-type MOSFETs according to the first and second embodiments of the present invention.
Figure 26B:
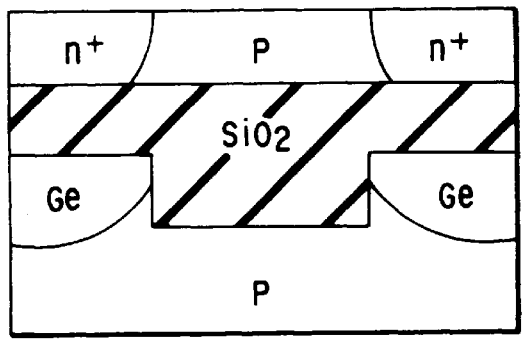
Figure 27:
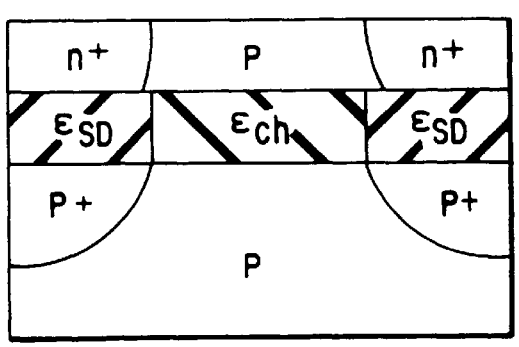
FIG. 27 is a cross-sectional view showing the construction of an SOI-type MISFET obtained by combination of the SOI-type MOSFETS according to the first and third embodiments of the present invention.

The present invention is not limited to the foregoing first to third embodiments. For example, they can be combined with one another. FIGS. 26A and 26B illustrate the construction of an SOI-type MOSFET obtained by combination of the first and second embodiments. In the MOSFET shown in FIG. 26A, the structure of the second embodiment is combined with that of the first embodiment wherein the high-concentration p-type regions are formed under the source and drain regions. In the MOSFET shown in FIG. 26B, the structure of the second embodiment is combined with that of the first embodiment wherein the $Si_xGe_{1-x}$ regions are formed under the source and drain regions. FIG. 27 illustrates the construction of an SOI-type MOSFET obtained by combination of the first and third embodiments. It is possible to modify the construction of FIG. 27 by replacing the p⁺-type region by the $Si_xGe_{1-x}$ region.

Figure 28:
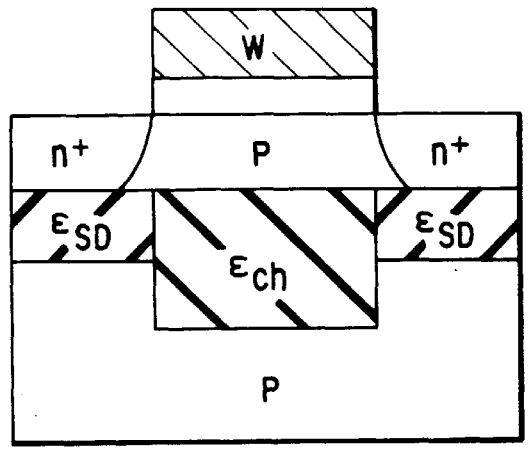
FIG. 28 is a cross-sectional view showing the construction of an SOI-type MISFET obtained by combination of the SOI-type MOSFETS according to the second and third embodiments of the present invention.
Figure 29:
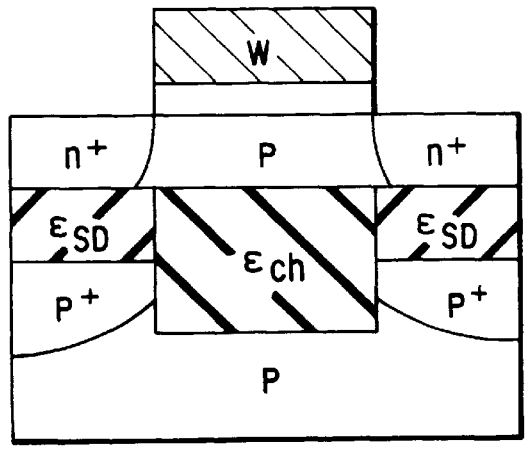
FIG. 29 is a cross-sectional view showing the construction of an SOI-type MISFET obtained by combination of the SOI-type MOSFETS according to the first, second and third embodiments of the present invention.

FIG. 28 illustrates the construction of an SOI-type MOSFET obtained by combination of the second and third embodiments, and FIG. 29 does the construction of an SOI-type MOSFET obtained by combination of the first, second and third embodiments. It is possible to modify the construction of FIG. 29 by replacing the p⁺-type region by the $Si_xGe_{1-x}$ region. By combining these embodiments, a more improved SOI-type MOSFET can be provided.

According to the present invention described above, an SOI-type MOSFET capable of reducing the short channel effect can be provided.

In the first embodiment, a high-concentration p-type region is formed in the semiconductor substrate. Therefore, the variations in threshold voltage Vth due to a reduction in channel length can be diminished and the short channel effect can be suppressed. Since, furthermore, a depletion layer extends in the semiconductor substrate under the channel region, the S coefficient of sub-threshold characteristics can be kept to a small value, and the amount of drain current flowing through a sub-threshold region can be decreased.

In the second embodiment, an insulation film (silicon oxide film) under the source and drain regions can be formed thinner than that under the channel region. As a result, the short channel effect can be lessened.

According to the third embodiment, a very high-speed SOI device can be provided wherein the threshold voltage can be set properly, the electrostatic capacitance of source and drain regions is reduced, and the short channel effect can be suppressed. Furthermore, it is possible to eliminate the drawback of preventing an increase in mobility, such as adjustment of threshold voltage by increasing the impurity concentration of the channel region, which is the significant feature of the thin-film SOI device.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming a semiconductor layer on a semiconductor substrate via a first insulation layer;

forming a second insulation layer on said semiconductor layer;

forming a gate electrode on said second insulation layer by patterning;

forming a high-concentration impurity region in said semiconductor substrate, by implanting ions whose conductivity type is equal to that of said semiconductor substrate, by using said gate electrode as a mask, an impurity concentration of said impurity region being higher than that of said semiconductor substrate; and forming source and drain regions in said semiconductor layer by implanting ions whose conductivity type is opposite to that of said semiconductor substrate, using said gate electrode as a mask.

2. A method for manufacturing a semiconductor device, comprising the steps of:

forming a first insulation layer on a semiconductor substrate;

forming a groove in said semiconductor substrate by etching said first insulation layer and said semiconductor substrate;

forming a second insulation layer in said groove and flattening upper surfaces of said first and second insulation layers;

forming a semiconductor layer on said first and second insulation layers;

forming a third insulation layer on said semiconductor layer;

forming a gate electrode on said third insulation layer by patterning; and forming source and drain regions in said semiconductor layer by implanting ions whose conductivity type is opposite to that of said semiconductor substrate, using said gate electrode as a mask.

3. A method for manufacturing a semiconductor device, comprising the steps of:

forming a first insulation layer on a semiconductor substrate;

etching a part of said insulation layer;

forming a first semiconductor layer, whose conductivity type is equal to that of said semiconductor substrate, in an etched portion of said insulation layer by epitaxial growth;

forming a second insulation layer on said first insulation layer and said first semiconductor layer;

forming a second semiconductor layer on said second insulation layer;

forming a third insulation layer on said second semiconductor layer;

forming a gate electrode on said third insulation layer by patterning; and forming source and drain regions in said second semiconductor layer by implanting ions whose conductivity type is opposite to that of said second semiconductor layer, using said gate electrode as a mask.

4. A method for manufacturing a semiconductor device, comprising the steps of:

forming a semiconductor layer on a semiconductor substrate via a first insulation layer;

forming a second insulation layer on said semiconductor layer;

forming a gate electrode on said second insulation layer;

forming a low permittivity region in said first insulation layer by ion-implanting fluorine into said first insulation layer using said gate electrode as a mask; and forming source and drain regions in said semiconductor layer over the low permittivity region by implanting ions whose conductivity type is opposite to that of said semiconductor layer, by using said gate electrode as a mask.

* * * * *